(12) United States Patent
Obiya et al.

(10) Patent No.: US 10,505,505 B2
(45) Date of Patent: Dec. 10, 2019

(54) POWER AMPLIFICATION MODULE, FRONT-END CIRCUIT, AND COMMUNICATION DEVICE

(71) Applicant: Murata Manufacturing Co., Ltd., Kyoto (JP)

(72) Inventors: Hidenori Obiya, Kyoto (JP); Shinya Hitomi, Kyoto (JP); Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/941,043

(22) Filed: Mar. 30, 2018

(65) Prior Publication Data

US 2018/0226928 A1 Aug. 9, 2018

Related U.S. Application Data

(63) Continuation of application No. PCT/JP2016/078807, filed on Sep. 29, 2016.

(30) Foreign Application Priority Data

Oct. 2, 2015 (JP) .................................. 2015-197205

(51) Int. Cl.
*H03F 3/14* (2006.01)
*H03F 3/191* (2006.01)
(Continued)

(52) U.S. Cl.
CPC .............. *H03F 3/245* (2013.01); *H03F 1/56* (2013.01); *H03F 3/195* (2013.01); *H03F 3/72* (2013.01);
(Continued)

(58) Field of Classification Search
CPC ............... H03F 3/14; H03F 3/68; H03F 3/191
(Continued)

(56) References Cited

U.S. PATENT DOCUMENTS 4,328,465 A * 5/1982 Takaoka ................... H03G 3/00
330/126
9,093,981 B2 7/2015 Tanaka et al.
(Continued)

FOREIGN PATENT DOCUMENTS

JP 2000-183664 A 6/2000
JP 2013-132015 A 7/2013
(Continued)

OTHER PUBLICATIONS

International Search Report for International Application No. PCT/JP2016/078807, dated Dec. 13, 2016.
(Continued)

*Primary Examiner* — Steven J Mottola
(74) *Attorney, Agent, or Firm* — Pearne & Gordon LLP

(57) ABSTRACT

A PA module includes a previous stage amplification element to amplify a high-frequency signal, a posterior stage amplification element to amplify the high-frequency signal amplified by the previous stage amplification element, and a variable filter circuit arranged between the previous stage amplification element and the posterior stage amplification element and to vary a pass band and an attenuation band in accordance with a frequency band of the high-frequency signal, in which the variable filter circuit includes a filter portion and switches, the previous stage amplification element, the switches, and the posterior stage amplification element are arranged on a mounting surface of a substrate, the filter portion is stacked and arranged so as to overlap with at least one of the previous stage amplification element, (Continued)

the switches, and the posterior stage amplification element when the substrate is viewed in a plan view.

12 Claims, 13 Drawing Sheets

(51) Int. Cl.
    *H03F 3/24*     (2006.01)
    *H04B 1/00*     (2006.01)
    *H04B 1/04*     (2006.01)
    *H04B 1/40*     (2015.01)
    *H03G 3/30*     (2006.01)
    *H03G 5/28*     (2006.01)
    *H03F 1/56*     (2006.01)
    *H03F 3/195*     (2006.01)
    *H03F 3/72*     (2006.01)
    *H04B 1/18*     (2006.01)
    *H04B 1/48*     (2006.01)

(52) U.S. Cl.
    CPC ............. *H03G 3/3042* (2013.01); *H03G 5/28* (2013.01); *H04B 1/00* (2013.01); *H04B 1/0057* (2013.01); *H04B 1/04* (2013.01); *H04B 1/0458* (2013.01); *H04B 1/18* (2013.01); *H04B 1/40* (2013.01); *H04B 1/48* (2013.01); *H03F 2200/111* (2013.01); *H03F 2200/451* (2013.01); *H03F 2203/7209* (2013.01); *H04B 2001/0408* (2013.01)

(58) Field of Classification Search
    USPC ............. 330/124 R, 126, 295, 302, 306, 307
    See application file for complete search history.

(56) References Cited

U.S. PATENT DOCUMENTS

2013/0163212 A1   6/2013   Tanaka et al.
2016/0112009 A1   4/2016   Hitomi et al.

FOREIGN PATENT DOCUMENTS

WO     2013/150564 A1   10/2013
WO     2015/002127 A1   1/2015

OTHER PUBLICATIONS

Written Opinion for International Application No. PCT/JP2016/078807, dated Dec. 13, 2016.

\* cited by examiner

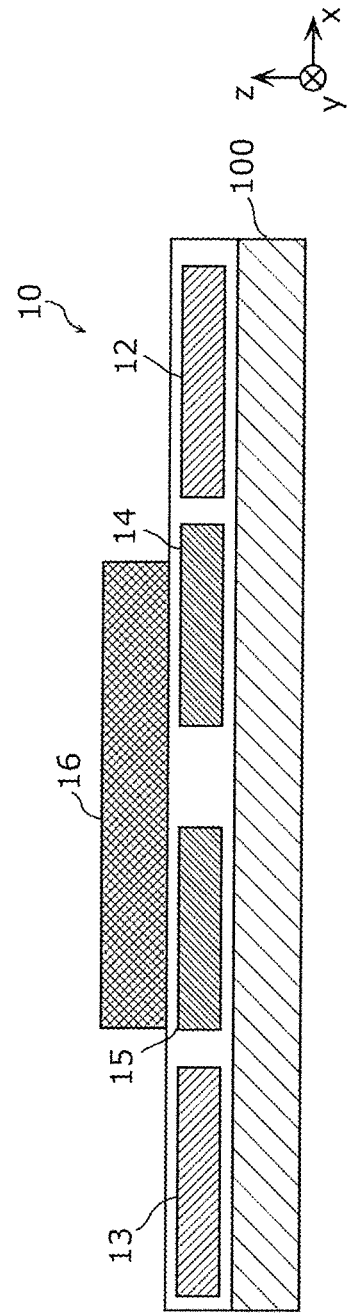

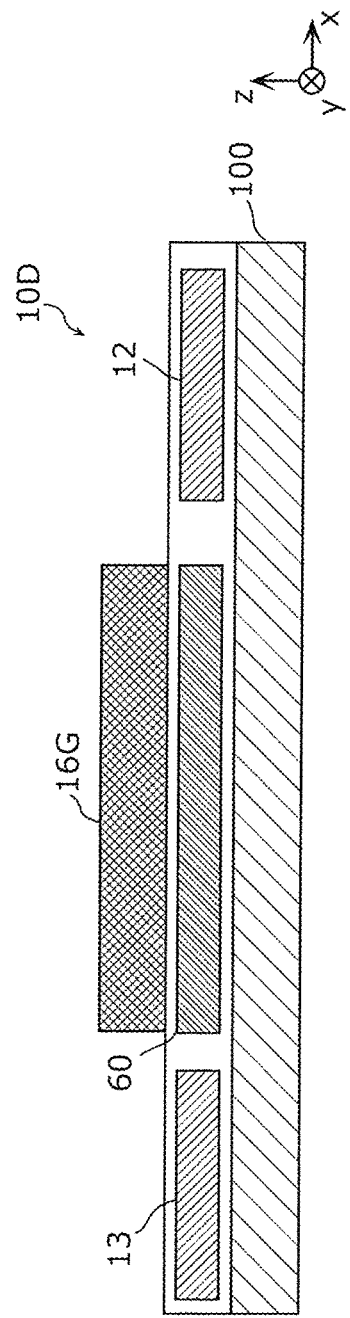

PRIOR ART

POWER AMPLIFICATION MODULE, FRONT-END CIRCUIT, AND COMMUNICATION DEVICE

This is a continuation of International Application No. PCT/JP2016/078807 filed on Sep. 29, 2016 which claims priority from Japanese Patent Application No. JP 2015-197205 filed on Oct. 2, 2015. The contents of these applications are incorporated herein by reference in their entireties.

BACKGROUND

Technical Field

The present disclosure relates to a power amplification module that amplifies a high-frequency signal, a front-end circuit, and a communication device.

Cellular phones in recent years are required to be compliant with a plurality of frequencies with one terminal (to be a multiband-compliant terminal), and to be compliant with a plurality of wireless systems with one terminal (to be a multimode-compliant terminal). There is demand for a multimode- and multiband-compliant front-end circuit to process a plurality of transmission and reception signals at a high speed without necessarily deteriorating quality. Furthermore, a front-end circuit of a wireless communication terminal represented by a cellular phone or the like is required to be reduced in size.

Patent Document 1 discloses a power amplifier (hereinafter, referred to as PA in some cases) module used for a multiband- and multimode-compliant transmission circuit.

FIG. 13 is a circuit configuration diagram of a PA module disclosed in Patent Document 1. As illustrated in the diagram, a PA module 510 includes a plurality of amplification elements 511a and 511b, a variable filter circuit 512, and a matching circuit 513. The amplification elements 511a and 511b amplify a transmission signal within a frequency range including a plurality of communication bands. The variable filter circuit 512 includes switch circuits 521a and 521b, and filter components 522a to 522c. A control IC included in the PA module 510 selects a filter component, among the filter components 522a to 522c, whose pass band is a transmission band and whose attenuation band is a reception band of selected communication bands to be used.

With the above-described configuration, when the PA amplifies a transmission signal, a reception band noise entering into a reception circuit can be effectively suppressed in the PA module.

Patent Document 1: International Publication No. 2015/002127

BRIEF SUMMARY

However, in a case where the PA module disclosed in Patent Document 1 is used for a front-end circuit, it is necessary to separately provide the switch circuits 521a and 521b for switching selection of the filter components 522a to 522c. Therefore, in a case where the switch circuits 521a and 521b, the amplification elements 511a and 511b, and the filter components 522a to 522c are mounted on a substrate, the size thereof increases.

Accordingly, the present disclosure provides a power amplification module, a front-end circuit, and a communication device which are reduced in size while maintaining quality of a high-frequency signal.

A power amplification module according to one aspect of the present disclosure includes a previous stage amplification element to amplify a high-frequency signal, a posterior stage amplification element to amplify the high-frequency signal amplified by the previous stage amplification element, and a variable filter circuit arranged between the previous stage amplification element and the posterior stage amplification element and to vary a pass band or an attenuation band in accordance with a frequency band of the high-frequency signal, in which the variable filter circuit includes one or more filter elements and a filter band selection portion to vary the pass band or the attenuation band of the variable filter circuit by being switched in accordance with the frequency band of the high-frequency signal, the previous stage amplification element, the filter band selection portion, and the posterior stage amplification element are arranged on a mounting surface of a substrate, and the one or more filter elements are stacked and arranged so as to overlap with at least one of the previous stage amplification element, the filter band selection portion, and the posterior stage amplification element when the substrate is viewed in a plan view.

With this configuration, by stacking and arranging the one or more filter elements so as to overlap with at least one of the previous stage amplification element, the filter band selection portion, and the posterior stage amplification element when the substrate is viewed in the plan view, an area of the power amplification module on the substrate can be reduced. Accordingly, the size thereof can be reduced while maintaining quality of the high-frequency signal.

Additionally, the one or more filter elements may be stacked and arranged so as to overlap with only at least one of the previous stage amplification element and the filter band selection portion among the previous stage amplification element, the filter band selection portion, and the posterior stage amplification element in the plan view.

Since a power level of the high-frequency signal to be amplified is large in the posterior stage amplification element, when the one or more filter elements are arranged in the vicinity of the posterior stage amplification element, filter characteristics of the filter elements deteriorate by interference with the high-frequency signal. In contrast, since the one or more filter elements are stacked and arranged so as not to overlap with the posterior stage amplification element in the plan view, the size can be reduced without necessarily deteriorating the characteristics of the filter element.

Additionally, the one or more filter elements may be stacked and arranged so as to overlap with only the filter band selection portion among the previous stage amplification element, the filter band selection portion, and the posterior stage amplification element in the plan view.

A power level in the previous stage amplification element is not as large as that in the posterior stage amplification element, but is larger than those of other high-frequency signals. Accordingly, the one or more filter elements can be not arranged in the vicinity of the previous stage amplification element as well as the posterior stage amplification element. According to the above-described configuration, the one or more filter elements are stacked and arranged so as not to overlap with the posterior stage amplification element and the previous stage amplification element in the plan view, the size can therefore be reduced without necessarily deteriorating the characteristics of the filter element. Furthermore, the one or more filter elements are arranged so as to be closest to the filter band selection portion, a wiring length of the variable filter circuit can therefore be shortened.

Additionally, the one or more filter elements may be configured of a plurality of filter elements with the pass bands or the attenuation bands which are different from one another, the filter band selection portion may include a first switch element arranged between the previous stage amplification element and the plurality of filter elements to switch a connection between an output terminal of the previous stage amplification element and each of the plurality of filter elements, and a second switch element arranged between the plurality of filter elements and the posterior stage amplification element and to switch a connection between an input terminal of the posterior stage amplification element and each of the plurality of filter elements, and the plurality of filter elements may be arranged so as to overlap with at least one of the first switch element and the second switch element in the plan view.

With this configuration, by operation of the first switch element and the second switch element, a filter element corresponding to a communication band to be used is connected between the previous stage amplification element and the posterior stage amplification element. Additionally, the filter element is arranged so as to overlap with at least one of the first switch element and the second switch element in the plan view, it is thus possible to suppress the posterior stage amplification element and the previous stage amplification element and the filter element from being arranged close to each other, and the size can be reduced while maintaining the quality of the high-frequency signal. Additionally, the filter element is arranged so as to be closest to the first switch element and the second switch element, the wiring length of the variable filter circuit can therefore be shortened.

Additionally, each of the plurality of filter elements may include an input terminal and an output terminal, the first switch element may include a first common terminal connected to the output terminal of the previous stage amplification element and a first selection terminal connected to an input terminal of one filter element among the plurality of filter elements, the second switch element may include a second common terminal connected to the input terminal of the posterior stage amplification element and a second selection terminal connected to an output terminal of the one filter element, and the first selection terminal and the second selection terminal may be arranged at a gap in which isolation between the first selection terminal and the second selection terminal in a case where the one filter element is not connected to the first switch element and the second switch element does not deteriorate more than isolation between the input terminal and the output terminal of the one filter element in a case where the first switch element and the second switch element are not connected to the one filter element.

In one case, the gap may be larger than a gap between the input terminal and the output terminal of the one filter element.

With this configuration, deterioration in attenuation characteristics of the filter element can be avoided.

Additionally, an attenuation of the one filter element in the attenuation band may be 16 dB or more.

With this configuration, a total noise level of an output end of the power amplification module in the attenuation band can be reduced, and a high-frequency signal with high quality can therefore be secured.

Additionally, at least one of the first switch element and the second switch element and the previous stage amplification element may be formed in one chip using a first chip, and the posterior stage amplification element may be included in a second chip which is different from the first chip.

With this configuration, not only height reduction in a stacking direction, but also area reduction by forming at least one of the first switch element and the second switch element and the previous stage amplification element in one chip is achieved. Additionally, the posterior stage amplification element with the high power level is formed in a chip which is different from the first chip. Accordingly, the size of the power amplification module can be further reduced while maintaining the quality of the high-frequency signal.

Additionally, at least a part of the filter band selection portion and the previous stage amplification element may be formed in one chip using a first chip, and the posterior stage amplification element may be included in a second chip which is different from the first chip.

With this configuration, not only the height reduction in the stacking direction, but also the area reduction by forming at least the part of the filter band selection portion and the previous stage amplification element in one chip is achieved. Additionally, the posterior stage amplification element with the high power level is formed in the chip which is different from the first chip. Accordingly, the size of the power amplification module can be further reduced while maintaining the quality of the high-frequency signal.

Additionally, the power amplification module may further include an amplification control portion to control amplification characteristics of the previous stage amplification element and the posterior stage amplification element in accordance with a communication band to be used, in which the amplification control portion may be included in the first chip.

With this configuration, the amplification control portion to control the amplification characteristics of each of the amplification elements in accordance with the communication band to be used is formed in one chip with the previous stage amplification element and the part of the filter band selection portion, the size can therefore be further reduced.

Additionally, the previous stage amplification element may amplify a high-frequency signal in a frequency range including a plurality of communication bands, the posterior stage amplification element may be configured of a plurality of amplification elements respectively corresponding to the plurality of communication bands, and in the posterior stage amplification element, a selected amplification element, among the plurality of amplification elements, corresponding to a communication band to be used among the plurality of communication bands may amplify the high-frequency signal amplified by the previous stage amplification element.

According to the above-described configuration, configuring the high-frequency signal in the frequency range including the plurality of communication bands with one previous stage amplification element can contribute to reduction in the size of the power amplification module, and arranging a plurality of amplification elements corresponding to the pass bands as the posterior stage amplification element makes it possible to maintain the high quality of a high-frequency transmission signal outputted from the power amplification module.

Additionally, one aspect of the present disclosure may be a front-end circuit including the power amplification module including the characteristic configurations as described above, a reception amplification circuit, and a wave separator to output a reception signal from an antenna element to the reception amplification circuit and to output the high-frequency signal amplified by the power amplification module to the antenna element as a transmission signal.

Additionally, in the variable filter circuit, the pass band may be a transmission band corresponding to a communication band to be used which is selected from the plurality of communication bands, and the attenuation band may be a reception band corresponding to the communication band to be used.

According to the above-described configuration, a front-end circuit reduced in size can be provided while maintaining quality of the high-frequency transmission signal and the high-frequency reception signal.

Additionally, one aspect of the present disclosure may be a communication device including the front-end circuit including the characteristic configurations as described above, an RF signal processing circuit to output a high-frequency transmission signal to the front-end circuit and to input a high-frequency reception signal from the front-end circuit, and a baseband signal processing circuit to perform signal processing by converting the high-frequency reception signal received from the RF signal processing circuit to an intermediate frequency signal and to convert an intermediate frequency signal to a high-frequency signal and to output the converted signal to the RF signal processing circuit.

According to the above-described configuration, a communication device reduced in size can be provided while maintaining quality of the high-frequency transmission signal and the high-frequency reception signal.

A power amplification module according to the present disclosure can be reduced in size while maintaining quality of a high-frequency signal by stacking a filter element with at least one of a previous stage amplification element, a filter band selection portion, and a posterior stage amplification element.

BRIEF DESCRIPTION OF THE SEVERAL VIEWS OF THE DRAWINGS

FIG. 3B is a cross-sectional configuration diagram of the PA module according to the first embodiment.

FIG. 9B is a cross-sectional configuration diagram of the PA module according to the second embodiment.

DETAILED DESCRIPTION

Figure 1:
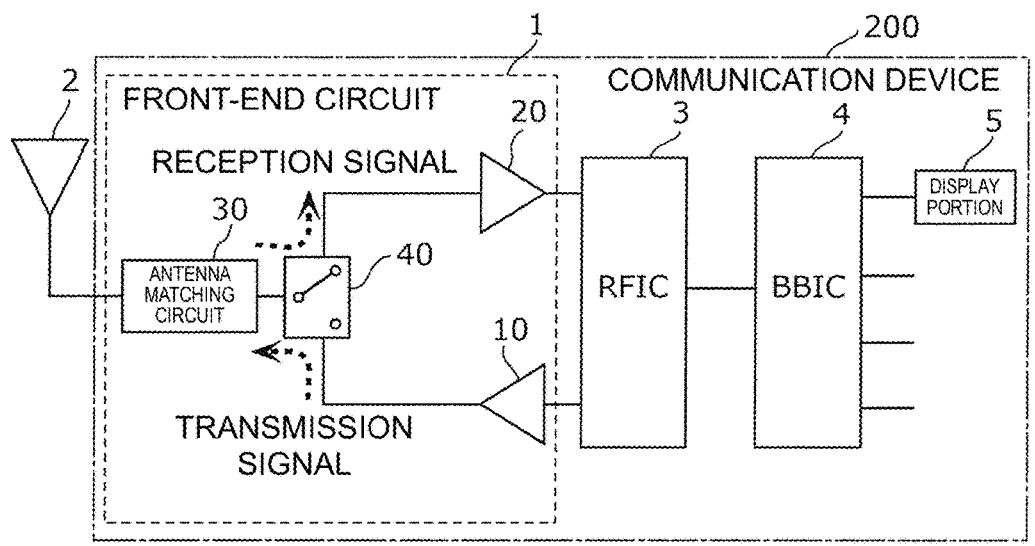
FIG. 1 is a functional block configuration diagram of a communication device according to a first embodiment.

Hereinafter, embodiments of the present disclosure will be described in detail using embodiments and drawings thereof. Note that, all embodiments described below indicate comprehensive or specific examples. Numerical values, shapes, materials, constituent elements, arrangement and connection forms of the constituent elements, and the like, which will be described in the following embodiments, are examples and are not intended to limit the present disclosure. Constituent elements which are not described in independent claims among the constituent elements in the following embodiments are described as arbitrary constituent elements. Additionally, sizes or size ratios of the constituent elements illustrated in the drawings are not necessarily strict.

First Embodiment 1.1 Communication Device Configuration

FIG. 1 is a functional block configuration diagram of a communication device 200 according to a first embodiment. This diagram illustrates the communication device 200 and an antenna element 2. The communication device 200 includes a front-end circuit 1, an RF signal processing circuit 3, a baseband signal processing circuit 4, and a display portion 5. The front-end circuit 1 is, for example, arranged in a front-end portion of a multimode/multiband-compliant cellular phone.

The front-end circuit 1 includes a PA (Power Amplifier) module 10, a low noise amplifier circuit 20, an antenna matching circuit 30, and an antenna switch 40.

The antenna matching circuit 30, which is connected to the antenna element 2 and the antenna switch 40, is a circuit for matching the antenna element 2 and the front-end circuit 1 with each other. With this, the front-end circuit 1 can receive a reception signal from the antenna element 2 with low loss, and output a transmission signal to the antenna element 2 with low loss. The antenna matching circuit 30 is configured of one or more high frequency circuit components, for example, formed of a chip-shaped inductor and a chip-shaped capacitor. Note that, the antenna matching circuit 30 is not a required constituent element of the front-end circuit 1. Additionally, the antenna matching circuit 30 may be a multiband- and multimode-compliant variable matching circuit which varies impedance in accordance with a selected band or mode.

The antenna switch 40 is a wave separator, by connecting the antenna element 2 (and the antenna matching circuit 30) and one of a transmission side signal path and a reception side signal path, for switching a connection between the antenna element 2 and each of the plurality of signal paths. To be more specific, the antenna switch 40 includes an input terminal connected to the antenna matching circuit 30 and an output terminal connected to the transmission side signal path or the reception side signal path.

Note that, although FIG. 1 illustrates the antenna switch 40 as a single-pole double-throw type high-frequency switch, in a case where a plurality of the transmission side signal paths and a plurality of the reception side signal paths are arranged, the antenna switch 40 is not limited to one-input two-output type. Additionally, instead of the antenna switch 40, a multiplexer including a duplexer and a triplexer which separate transmission waves and reception waves may be arranged.

The PA module 10 is a power amplification module which amplifies a high-frequency transmission signal outputted from the RF signal processing circuit 3 and outputs the resulting signal toward the antenna switch 40. The PA module 10 is a primary element of the present disclosure and will be described later in detail.

The low noise amplifier circuit 20 is a high-frequency amplification circuit which amplifies a high-frequency reception signal outputted from the antenna switch 40 and outputs the resulting signal to the RF signal processing circuit 3.

The RF signal processing circuit 3 performs signal processing on the high-frequency reception signal inputted from the antenna element 2 through the reception side signal path by down conversion or the like, and outputs a reception signal generated by the signal processing to the baseband signal processing circuit 4. The RF signal processing circuit 3 is an RFIC (Radio Frequency Integrated Circuit), for example. Additionally, the RF signal processing circuit 3 performs signal processing on a transmission signal inputted from the baseband signal processing circuit 4 by up conversion or the like, and outputs a high-frequency transmission signal generated by the signal processing to the PA module 10.

The baseband signal processing circuit 4 is a circuit which performs signal processing using an intermediate frequency band with a lower frequency than that of the high-frequency signal in the front-end circuit. An image signal processed by the baseband signal processing circuit 4 is used for image display in the display portion 5, for example, and an audio signal processed by the baseband signal processing circuit 4 is used for a call through a speaker, for example.

Note that, the front-end circuit 1 may include a transmission side filter circuit capable of varying bandpass characteristics in accordance with a selected frequency band in the transmission side signal path between the antenna switch 40 and the PA module 10. Additionally, the front-end circuit 1 may include a reception side filter circuit capable of varying bandpass characteristics in accordance with a selected frequency band in the reception side signal path between the antenna switch 40 and the low noise amplifier circuit 20.

1.2 PA Module Configuration

Figure 2:
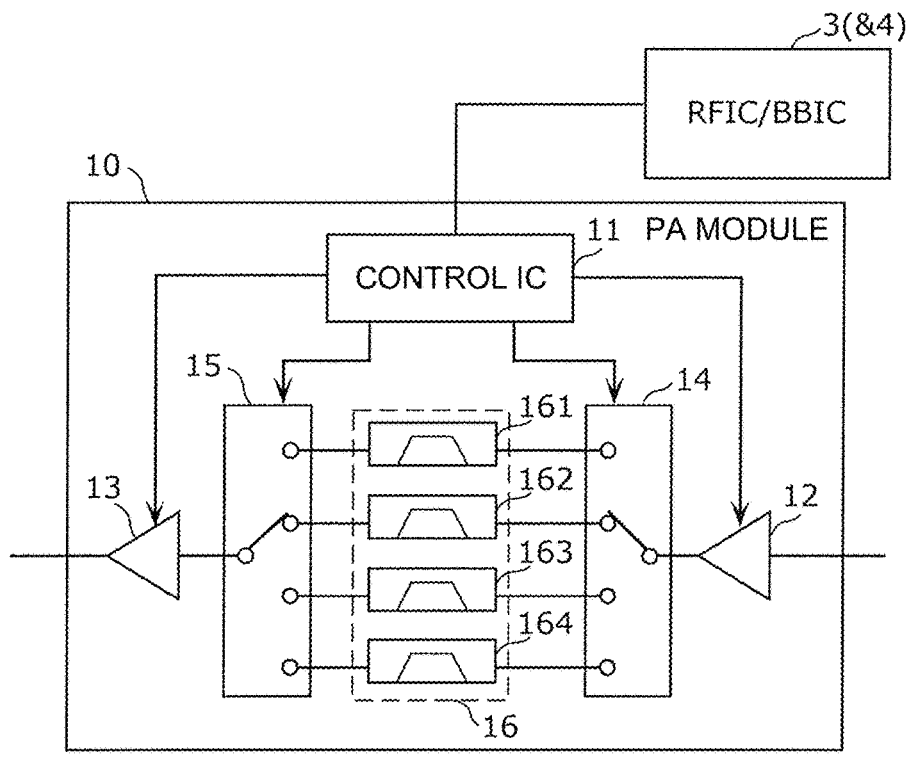
FIG. 2 is a circuit configuration diagram of a PA module according to the first embodiment.

FIG. 2 is a circuit configuration diagram of the PA module 10 according to the first embodiment. The PA module 10 is applied to the PA module 10 of the front-end circuit 1 illustrated in FIG. 1. The PA module 10 includes a control IC 11, a previous stage amplification element 12, a posterior stage amplification element 13, switches 14 and 15, and a filter portion 16.

The previous stage amplification element 12 and the posterior stage amplification element 13 are multimode/multiband-compliant power amplifiers which can be used in a plurality of communication schemes and a plurality of communication bands. An input terminal of the previous stage amplification element 12 is an input terminal of the PA module 10, and an output terminal of the previous stage amplification element 12 is connected to a common terminal of the switch 14. An input terminal of the posterior stage amplification element 13 is connected to a common terminal of the switch 15, and an output terminal of the posterior stage amplification element 13 is an output terminal of the PA module 10.

The filter portion 16 includes filter elements 161, 162, 163, and 164 whose pass bands and attenuation bands are different from one another. The filter elements 161 to 164 are typical band pass filters, but may be a low pass filter, a high pass filter, or a band elimination filter depending on a frequency arrangement relationship of a plurality of pass bands. Note that, examples of the filter elements 161 to 164 include a surface acoustic wave filter, a boundary acoustic wave filter, an elastic wave filter using a BAW (Bulk Acoustic Wave), an LC filter configured of an inductance element and a capacitor element, and the like. Additionally, the number of the filter elements configuring the filter portion 16 is not limited to four pieces, is determined in accordance with the number of bands or the number of modes which will be used.

The switch 14 is arranged between the previous stage amplification element 12 and the filter portion 16, and is a first switch element for switching a connection between the output terminal of the previous stage amplification element 12 and the filter portion 16. The switch 14 includes one common terminal and four selection terminals, the one common terminal is connected to the output terminal of the previous stage amplification element 12, the four selection terminals are respectively connected to one side terminals of the filter elements 161 to 164.

The switch 15 is arranged between the posterior stage amplification element 13 and the filter portion 16, and is a second switch element for switching a connection between the input terminal of the posterior stage amplification element 13 and the filter portion 16. The switch 15 includes one common terminal and four selection terminals, the one common terminal is connected to the input terminal of the posterior stage amplification element 13, the four selection terminals are respectively connected to the other side terminals of the filter elements 161 to 164. In the switches 14 and 15, by a control signal supplied from any one of the control IC 11, the RF signal processing circuit 3, and the baseband signal processing circuit 4, which will be described later, the one common terminal and any one of the four selection terminals are connected to each other.

The switches 14 and 15 and the filter portion 16 are arranged in a signal path from the output terminal of the previous stage amplification element 12 to the input terminal of the posterior stage amplification element 13, and configure a variable filter circuit which varies a pass band and an attenuation band in accordance with a frequency band of a high-frequency signal.

The switches 14 and 15 configure a filter band selection portion which varies the pass band and the attenuation band of the variable filter circuit by being switched in accordance with the frequency band of the high-frequency signal.

The control IC 11 is an amplification control portion which controls amplification characteristics of the previous stage amplification element 12 and the posterior stage amplification element 13 in accordance with a communication band to be used (the frequency band of the high-frequency signal). Note that, the amplification characteristics of the previous stage amplification element 12 and the posterior stage amplification element 13 are, for example, gains (amplification factor) of the previous stage amplification element 12 and the posterior stage amplification element 13. Additionally, the control IC 11 controls the switches 14 and 15 on the basis of a control signal indicating a communication band to be selected and used (the frequency band of the high-frequency signal) supplied from the RF signal processing circuit 3 or the baseband signal processing circuit 4. To be more specific, in a case where the above-described control signal indicates that a band A is selected, for example, the control IC 11 controls the switches 14 and 15 such that the filter element 161 whose pass band is a transmission band of the band A and whose attenuation band is a reception band of the band A is connected to the previous stage amplification element 12 and the posterior stage amplification element 13.

According to the above-described configuration, the high-frequency transmission signal inputted into the PA module 10 from the RF signal processing circuit 3 is amplified by the previous stage amplification element 12. The amplified high-frequency transmission signal is inputted into the variable filter circuit. The high-frequency transmission signal inputted into the variable filter circuit passes through a filter element corresponding to a communication method and a communication band. The high-frequency transmission signal which has passed through the variable filter circuit is further amplified by the posterior stage amplification element 13 and outputted from the PA module 10.

Although, when the high-frequency transmission signal having the selected frequency band is amplified by the PA module, a reception band component of the frequency band is also amplified by the previous stage amplification element 12, the amplified reception band component attenuates by passing through the filter element selected on the basis of the selected frequency band. Accordingly, it is possible to previously and effectively suppress, in the PA module 10, the amplified reception band component from entering into the low noise amplifier circuit 20 or the like and being a reception band noise.

Additionally, according to the above-described configuration, a circuit can be obtained in which characteristics of a filter, an antenna switch, or the like which is arranged subsequent to the RF signal processing circuit 3 and the PA module 10 can be eased and in which increase in an area is minimized.

Here, in the existing PA module 510 disclosed in Patent Document 1, the amplification elements 511a and 511b, which are in a cascading connection, being compliant with multiple bands contribute to reduction in the number of the amplification elements, but a reduction effect on the number of components is small as a whole because the switch circuits 521a and 521b are added. Accordingly, in a case where constituent elements of the PA module 510, in other words, the switch circuits 521a and 521b, the amplification elements 511a and 511b, and the filter components 522a to 522c are mounted on a substrate, there is a limit to reduce the area thereof, and thus this configuration cannot contribute to reduction in size of the front-end circuit.

In contrast, in the PA module according to the present embodiment and variations thereon, the filter portion 16 is stacked and arranged so as to overlap with at least one of the previous stage amplification element 12, the filter band selection portion, and the posterior stage amplification element 13, when a substrate on which these are mounted is viewed in a plan view.

Figure 3A:
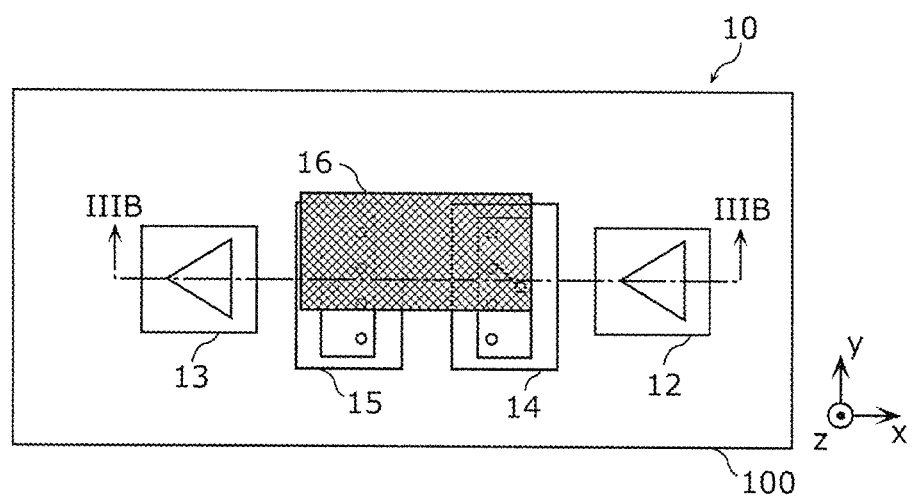
FIG. 3A is a planar configuration diagram of the PA module according to the first embodiment.

FIG. 3A is a planar configuration diagram of the PA module 10 according to the first embodiment, FIG. 3B is a cross-sectional configuration diagram of the PA module 10 according to the first embodiment. Specifically, FIG. 3B is a cross-sectional view taken by cutting along a IIIB-IIIB line in FIG. 3A.

As illustrated in FIG. 3A and FIG. 3B, in the PA module 10 according to the present embodiment, the previous stage amplification element 12, the posterior stage amplification element 13, and the switches 14 and 15 are mounted and arranged on a substrate 100 (in a z-axis direction in the diagram). Furthermore, the filter portion 16 is mounted and arranged on the switches 14 and 15 (in the z-axis direction). In other words, the filter portion 16 is stacked and arranged (stacked) so as to overlap with the switches 14 and 15 when the substrate 100 is viewed in a plan view.

Examples of the substrate 100 include, in addition to a ceramic substrate, a glass epoxy substrate, a flexible substrate, or the like, an electrode pattern formed on a surface of the substrate 100 and each of the previous stage amplification element 12, the posterior stage amplification element 13, and the switches 14 and 15 are bonded to each other using solder, a bump, or the like. Additionally, in the switches 14 and 15 and the filter portion 16, electrode patterns formed on upper portions of the switches 14 and 15 and an electrode pattern formed on a lower portion of the filter portion 16 are bonded to each other using solder, a bump, or the like.

Note that, in FIG. 3A and FIG. 3B, illustration of wirings connecting the previous stage amplification element 12, the posterior stage amplification element 13, the switches 14 and 15, and the filter portion 16 is omitted.

According to the above-described configuration, by stacking and arranging the filter portion 16 and the switches 14 and 15 so as to overlap with each other when the substrate 100 is viewed in the plan view, the area of the PA module 10 on the substrate 100 can be reduced. Accordingly, the size thereof can be reduced while maintaining quality of the high-frequency signal.

1.3 PA Module Configuration According to First to Third Variations

Figure 4A:
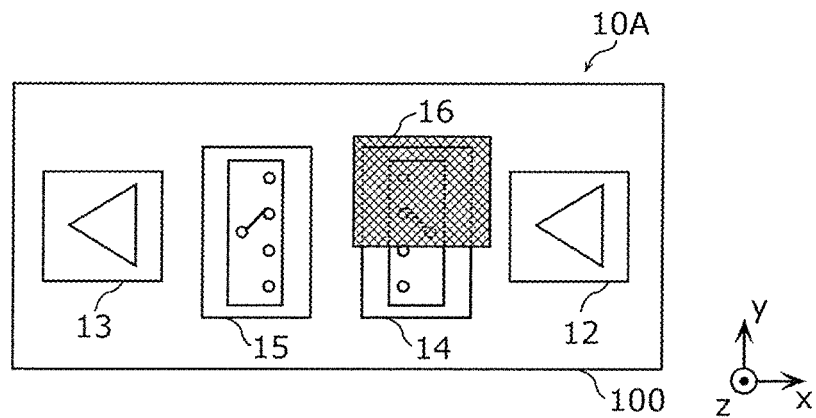
FIG. 4A is a planar configuration diagram of the PA module according to a first variation on the first embodiment.
Figure 4B:
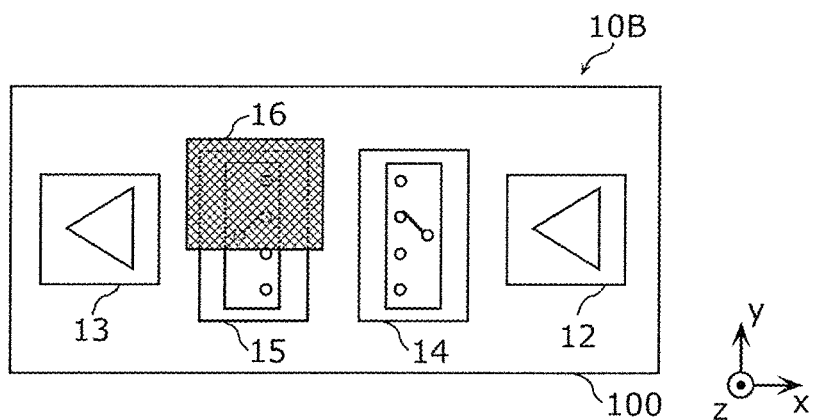
FIG. 4B is a planar configuration diagram of the PA module according to a second variation on the first embodiment.
Figure 4C:
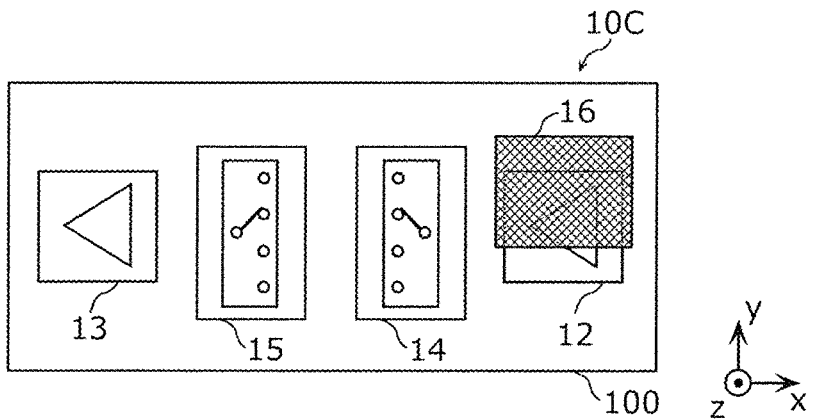
FIG. 4C is a planar configuration diagram of the PA module according to a third variation on the first embodiment.

FIG. 4A, FIG. 4B, and FIG. 4C are planar configuration diagrams of PA modules 10A, 10B, and 10C according to first, second, and third variations on the first embodiment, respectively. The PA modules 10A to 10C according to these variations include the same constituent elements as those of the PA module 10 according to the first embodiment, but are different from the PA module 10 in stacked and arranged modes. Hereinafter, descriptions of each of the constituent elements configuring the PA modules 10A to 10C will be omitted, and primarily the points that are different from the PA module 10 will be described.

As illustrated in FIG. 4A, in the PA module 10A according to the first variation, the previous stage amplification element 12, the posterior stage amplification element 13, and the switches 14 and 15 are mounted and arranged on the substrate 100 (in a z-axis direction in the diagram). Furthermore, the filter portion 16 is mounted and arranged on the switch 14 (in the z-axis direction). In other words, the filter portion 16 is stacked and arranged (stacked) so as to overlap with the switch 14 when the substrate 100 is viewed in the plan view.

Additionally, as illustrated in FIG. 4B, in the PA module 10B according to the second variation, the previous stage amplification element 12, the posterior stage amplification element 13, and the switches 14 and 15 are mounted and arranged on the substrate 100 (in the z-axis direction in the diagram). Furthermore, the filter portion 16 is mounted and arranged on the switch 15 (in the z-axis direction). In other words, the filter portion 16 is stacked and arranged (stacked) so as to overlap with the switch 15 when the substrate 100 is viewed in the plan view.

Additionally, as illustrated in FIG. 4C, in the PA module 10C according to the third variation, the previous stage amplification element 12, the posterior stage amplification element 13, and the switches 14 and 15 are mounted and arranged on the substrate 100 (in the z-axis direction in the diagram). Furthermore, the filter portion 16 is mounted and arranged on the previous stage amplification element 12 (in the z-axis direction). In other words, the filter portion 16 is stacked and arranged (stacked) so as to overlap with the previous stage amplification element 12 when the substrate 100 is viewed in the plan view.

Here, since a power level of the high-frequency signal to be amplified is large in the posterior stage amplification element 13, when the filter portion 16 is arranged in the vicinity of the posterior stage amplification element 13, filter characteristics of the filter portion 16 deteriorate by interference with the above-described high-frequency signal. In contrast, in the PA modules 10A, 10B, and 10C according to the above-described first to third variations, since the filter portion 16 is not stacked and arranged on the posterior stage amplification element 13, the size can be reduced while effectively suppressing the deterioration in the characteristics of the filter portion 16.

Additionally, in the PA modules 10A and 10B according to the above-described first and second variations, furthermore, the filter portion 16 is not stacked and arranged on the previous stage amplification element 12, either.

A power level in the previous stage amplification element 12 is not as large as that in the posterior stage amplification element 13, but is larger than those of other high-frequency signals. Accordingly, the filter portion 16 can be not arranged in the vicinity of the previous stage amplification element 12 as well as the posterior stage amplification element 13. According to each configuration of the above-described first and second variations, the filter portion 16 is stacked and arranged so as not to overlap with the posterior stage amplification element 13 and the previous stage amplification element 12 in a plan view, in comparison with the PA module 10C illustrated in FIG. 4C, the size can therefore be reduced without necessarily further deteriorating the characteristics of the filter portion 16.

Furthermore, in the PA modules 10A and 10B according to the above-described first and second variations, the filter portion 16 is arranged so as to be closest to the switches 14 and 15 configuring the filter band selection portion, a wiring length of the variable filter circuit can therefore be shortened.

1.4 Electrode Arrangement Configuration of Filter Portion According to First Embodiment Here, optimization of stack and arrangement of the filter portion 16 and the switches 14 and 15 in the PA module 10 according to the first embodiment will be described.

Figure 5A:
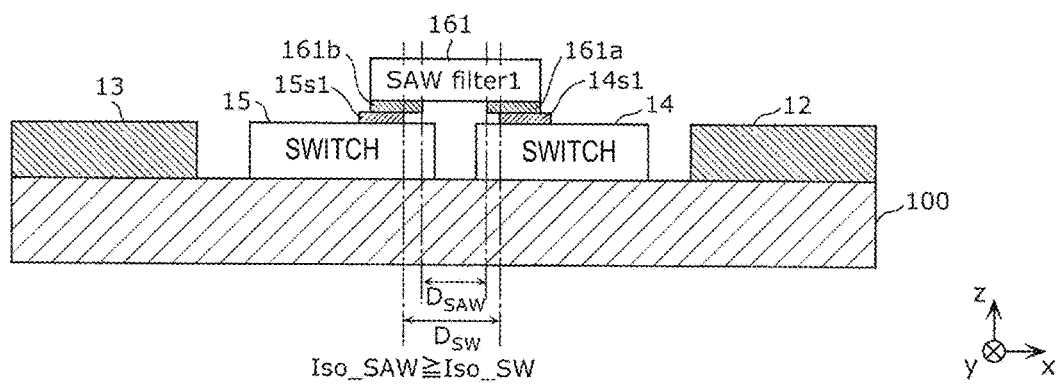
FIG. 5A is a structural cross-sectional view illustrating an electrode arrangement of a filter portion according to the first embodiment.

FIG. 5A is a structural cross-sectional view illustrating an electrode arrangement of the filter portion 16 according to the first embodiment. The cross-sectional view illustrated in FIG. 5A is a cross-sectional view taken by cutting along a IIIB-IIIB line in FIG. 3A, and more specifically illustrates the structural cross-sectional view in FIG. 3B. FIG. 5A illustrates an arrangement relationship between the filter element 161 (for example, a SAW filter) of the filter portion 16 and the switches 14 and 15. As illustrated in FIG. 5A, an input terminal 161a of the filter element 161 and a first selection terminal 14s1 of the switch 14 are bonded to each other, an output terminal 161b of the filter element 161 and a second selection terminal 15s1 of the switch 15 are bonded to each other. At this time, depending on a magnitude relationship between a gap $D_{SAW}$ between the input terminal 161a and the output terminal 161b of the filter element 161 and a gap $D_{SW}$ between the first selection terminal 14s1 of the switch 14 and the second selection terminal 15s1 of the switch 15, attenuation characteristics of the filter element 161 change.

For example, comparing a case where $D_{SW}$ is larger than $D_{SAW}$ with a case where $D_{SW}$ is smaller than $D_{SAW}$, isolation of the filter element 161 does not deteriorate in the case where $D_{SW}$ is larger than $D_{SAW}$ more than that in the other case by the arrangement of the switches 14 and 15, an original isolation of the filter element 161 is easy to be secured.

Figure 6A:
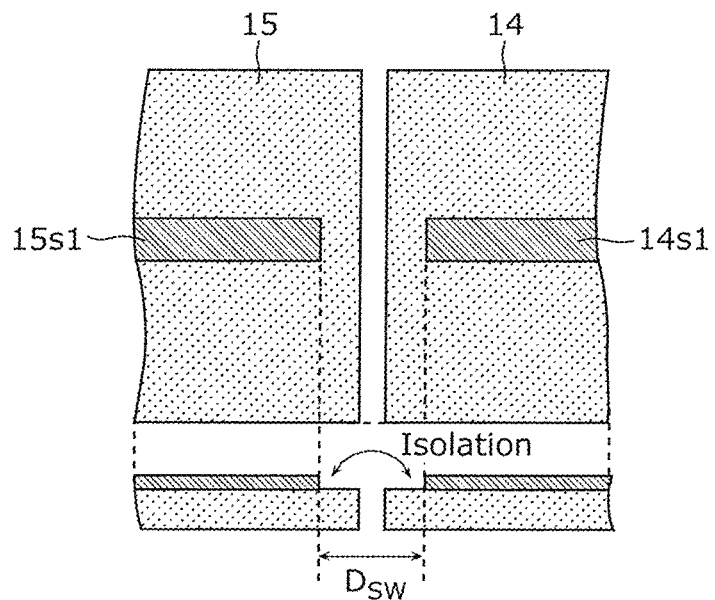
FIG. 6A is a diagram illustrating an electrode layout in a case where isolation between two switches is calculated.
Figure 6B:
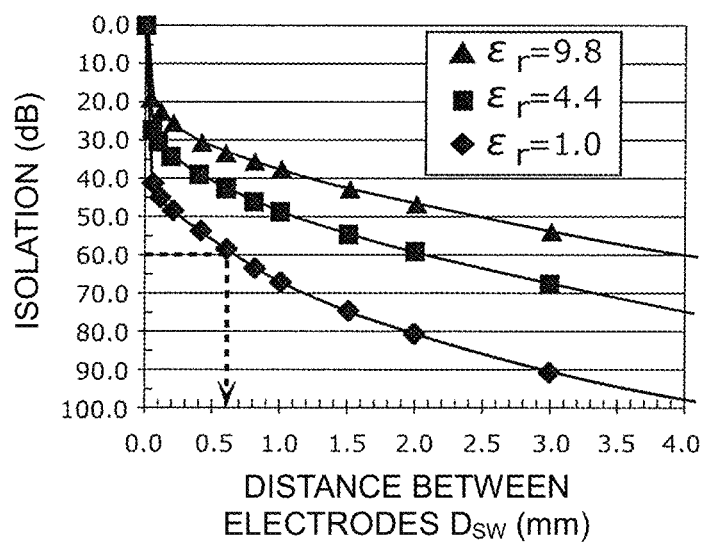
FIG. 6B is a graph illustrating a relationship between a distance between electrodes of the two switches and the isolation.

FIG. 6A is a diagram illustrating an electrode layout in a case where isolation between the two switches is calculated. Additionally, FIG. 6B is a graph illustrating a relationship between a distance between electrodes of the two switches and the isolation. The graph illustrating the relationship between the distance between electrodes $D_{SW}$ and the isolation illustrated in FIG. 6B is a graph in a case where an arrangement configuration of the switches 14 and 15 and the first selection terminal 14s1 and the second selection terminal 15s1 illustrated in FIG. 6A is assumed. Furthermore this is a graph in a case where the environment of the switches 14 and 15 is assumed to be filled with a dielectric having a relative dielectric constant εr.

As illustrated in FIG. 6B, the isolation between the two switches 14 and 15 increases (more favorable) as the distance between electrodes $D_{SW}$ increases. Additionally, the isolation between the two switches 14 and 15 deteriorates as a value of the relative dielectric constant 6r increases.

Here, for example, it is assumed that the isolation between the input and output terminals of the filter element 161 alone is 60 dB in a predetermined frequency band. At this time, in a case where the environment of the switches 14 and 15 is filled with the air (εr=1.0), as illustrated in FIG. 6B, the distance between electrodes $D_{SW}$ can be set to 0.6 mm or more. With this configuration, even in a case where the filter element 161 is mounted on the switches 14 and 15, the isolation between the input and output terminals of the filter element 161 alone can be secured.

Here, isolation between the switches 14 and 15 in a case where the filter element 161 is not connected to the switches 14 and 15 is defined as Iso_SW, isolation between the input and the output of the filter element 161 in a case where the switches 14 and 15 are not connected to the filter element 161 is defined as Iso_SAW. In this case, the first selection terminal 14$s$1 of the switch 14 and the second selection terminal 15$s$1 of the switch 15 are desirably arranged with a predetermined gap such that Iso_SW≥Iso_SAW is satisfied.

Note that, as for the above-described arrangement relationship, not only the filter element 161, but also the other filter elements 162 to 164 desirably have the same arrangement relationship.

By the above-described arrangement of the switches 14 and 15, deterioration in the attenuation characteristics of the filter elements 161 to 164 can be avoided.

Note that, the electrodes formed on the switches 14 and 15 are not limited to modes in which the electrodes are formed on only upper portion of the switches 14 and 15 as illustrated in FIG. 5A.

Figure 5B:
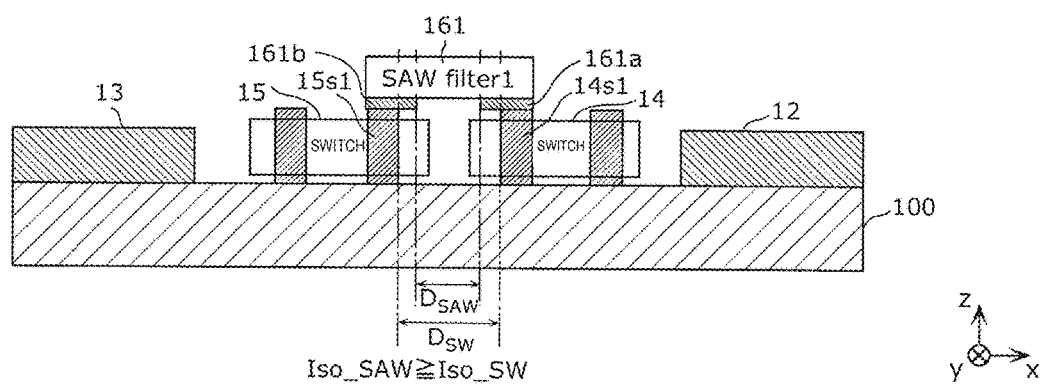
FIG. 5B is a structural cross-sectional view illustrating the electrode arrangement of the filter portion according to a fourth variation on the first embodiment.

FIG. 5B is a structural cross-sectional view illustrating an electrode arrangement of the filter portion 16 according to a fourth variation on the first embodiment. As illustrated in this diagram, even in an electrode structure which is formed so as to surround a main body of each of the switches 14 and 15, the first selection terminal and the second selection terminal desirably have an arrangement configuration such that Iso_SW≥Iso_SAW is satisfied in the same manner.

Figure 7:
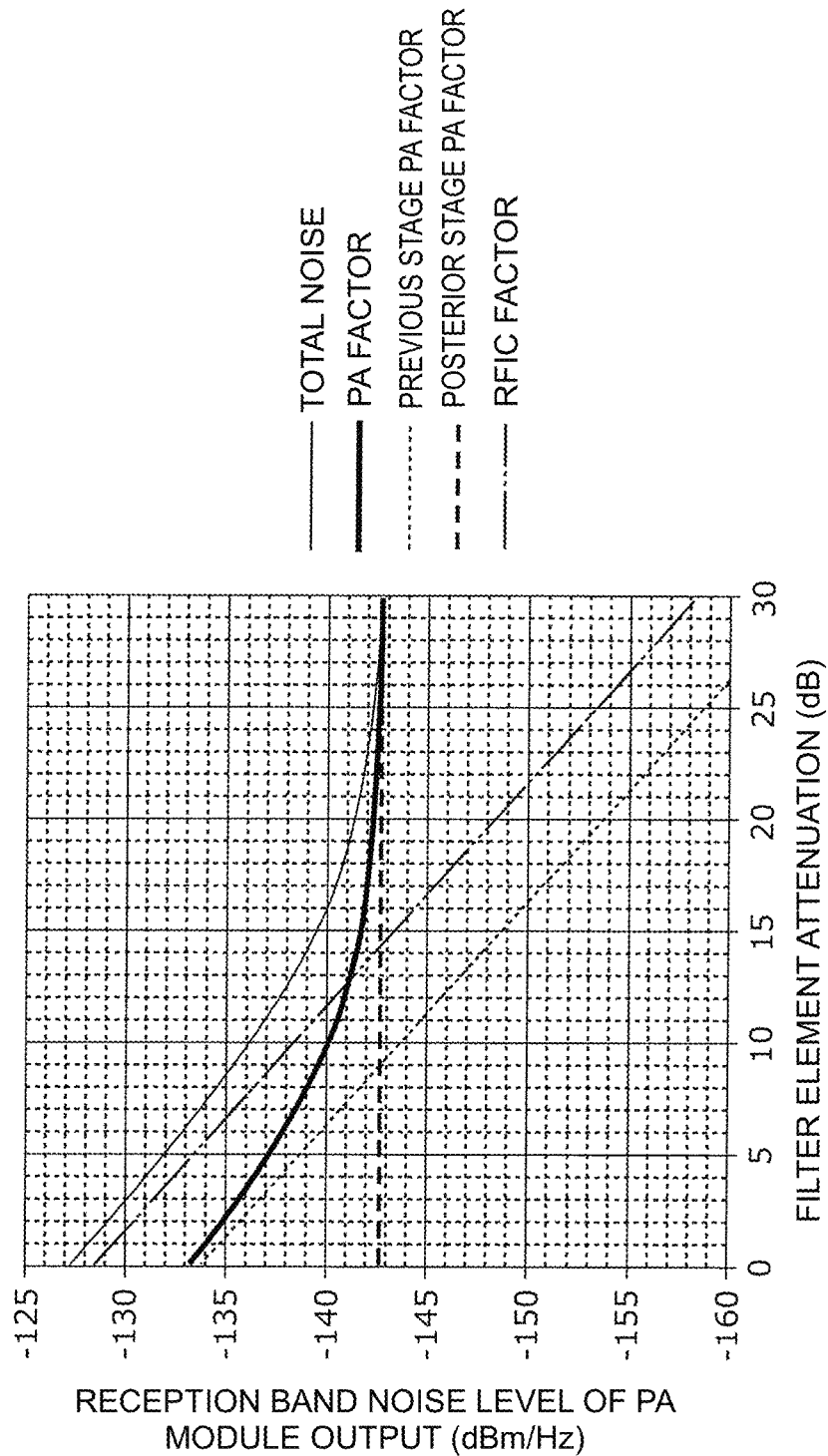
FIG. 7 is a graph illustrating a relationship between attenuation characteristics of a filter element and an output noise of the PA module.

1.5 Attenuation Characteristics of Filter Portion According to First Embodiment FIG. 7 is a graph illustrating a relationship between the attenuation characteristics of the filter element and an output noise of the PA module. To be more specific, a horizontal axis in FIG. 7 represents an attenuation (insertion loss) in attenuation bands of the filter elements 161 to 164, a vertical axis represents a reception band noise level caused by the RF signal processing circuit 3 alone, a reception band noise level caused by the previous stage amplification element 12 alone, a reception band noise level caused by the posterior stage amplification element 13 alone, a reception band noise level caused by the PA module alone, and a total noise level of the reception band at the PA module output end.

The reception band noise level caused by the PA module alone (a PA factor in FIG. 7) is a noise level obtained by combining the reception band noise level caused by the previous stage amplification element 12 alone (a previous stage PA factor in FIG. 7) and the reception band noise level caused by the posterior stage amplification element 13 alone (a posterior stage PA factor in FIG. 7). With this, the total noise level of the reception band at the PA module output end (a total noise in FIG. 7) is a noise level obtained by combining the reception band noise level caused by the PA module alone (a PA factor in FIG. 7) and the reception band noise level caused by the RF signal processing circuit 3 alone (an RFIC factor in FIG. 7).

Except the reception band noise level caused by the posterior stage amplification element 13 alone (the posterior stage PA factor in FIG. 7), the other reception band noise levels depend on the attenuation (insertion loss) in the reception bands of the filter elements 161 to 164, and decrease as the attenuation increases.

The total noise level of the reception band at the PA module output end can be −140 (dBm/Hz) or smaller as an index to secure a high-frequency reception signal with high quality.

This is because, when the above-described numerical value is satisfied, a noise of a signal sneaking into the reception circuit from the transmission circuit can be reduced.

The reasons of this are as follows. First, when the reception band noise level of the signal sneaking into the reception circuit from the transmission circuit exceeds −180 (dBm/Hz) immediately before the input of the low noise amplifier circuit 20, reception sensitivity deteriorates in the communication device 200.

Accordingly, the reception band noise level of the signal sneaking into the reception circuit from the transmission circuit is ideally −180 (dBm/Hz) or smaller immediately before the input of the low noise amplifier circuit 20.

Additionally, in a case where the antenna switch 40 is arranged in the front-end circuit 1, the transmission signal and the reception signal do not coexist, there is therefore no signal sneaking into the reception circuit from the transmission circuit. On the other hand, as described above, in a case where a tunable duplexer is arranged instead of the antenna switch 40, the signal sneaking into the reception circuit from the transmission circuit may be generated. At this time, since an attenuation of the tunable duplexer is approximately 40 (dB), in order to reduce the noise caused by the signal sneaking into the reception circuit from the transmission circuit, a total noise level of the reception band at the PA module output end is required to be −140 (dBm/Hz) or smaller.

Referring to FIG. 7 from this standpoint, the attenuation (insertion loss) in the attenuation bands of the filter elements 161 to 164 can be 16 dB or more.

Furthermore, the attenuation (insertion loss) in the attenuation bands of the filter elements 161 to 164 is desirably 20 dB or more, and is more desirably 25 dB or more.

The total noise level of the reception band at the PA module output end can be reduced by the attenuation (insertion loss) in the attenuation bands of the filter elements 161 to 164 as described above, a high-frequency reception signal with high quality can therefore be secured.

Note that, in a case where a duplexer is used instead of the antenna switch 40, since an attenuation of the duplexer is approximately 45 (dB), in order to secure a high-frequency reception signal with high quality, it is sufficient that the total noise level of the reception band at the PA module output end is −135 (dBm/Hz) or smaller. In this case, the attenuation (insertion loss) in the attenuation bands of the filter elements 161 to 164 can be 9 dB or more.

Second Embodiment

A power amplification module 10D according to the present embodiment is different from the power amplification module 10 according to the first embodiment in the configuration of the variable filter circuit arranged between the previous stage amplification element 12 and the posterior stage amplification element 13. Hereinafter, descriptions of common points to the PA module 10 according to the first embodiment will be omitted, and the points that are different from the PA module 10 will primarily be described.

2.1 PA Module Configuration

Figure 8:
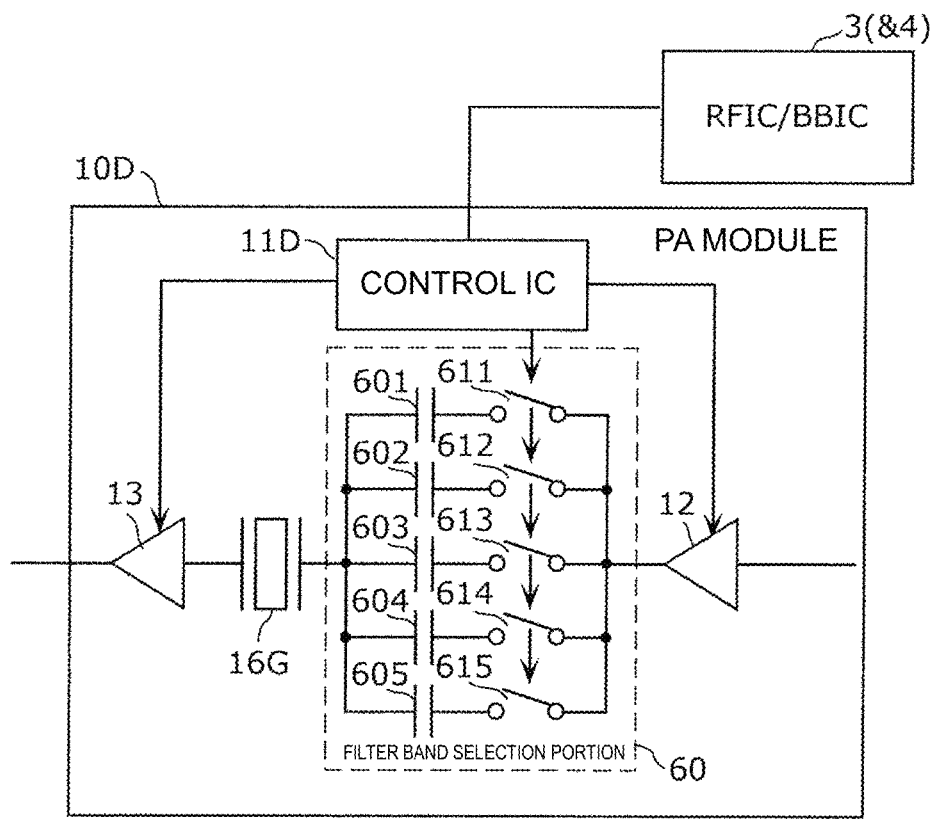
FIG. 8 is a circuit configuration diagram of a PA module according to a second embodiment.

FIG. 8 is a circuit configuration diagram of the PA module 10D according to a second embodiment. The PA module 10D is applied to the PA module 10 of the front-end circuit 1 illustrated in FIG. 1. The PA module 10D includes a control IC 11D, the previous stage amplification element 12, the posterior stage amplification element 13, a resonator 16G, and a filter band selection portion 60.

The previous stage amplification element 12 and the posterior stage amplification element 13 are multimode/multiband-compliant power amplifiers which can be used in a plurality of communication methods and a plurality of communication bands. The input terminal of the previous stage amplification element 12 is an input terminal of the PA module 10D, and the output terminal of the previous stage amplification element 12 is connected to an input terminal of the filter band selection portion 60. The input terminal of the posterior stage amplification element 13 is connected to an output terminal of the resonator 16G, and the output terminal of the posterior stage amplification element 13 is the output terminal of the PA module 10D.

The resonator 16G is a capacitive surface acoustic wave resonator configured of a piezoelectric substrate and comb-shaped electrodes formed on the piezoelectric substrate, for example, and is a filter element having a resonance point and an anti-resonance point determined by physical properties of the piezoelectric substrate, a shape of the comb-shaped electrode, and the like. Note that, the resonator 16G may not necessarily be the surface acoustic wave resonator, may be a boundary acoustic wave resonator, an elastic wave resonator using a BAW (Bulk Acoustic Wave), an LC resonator configured of an inductance element and a capacitor element, and the like.

The filter band selection portion 60 includes the input terminal and an output terminal, the output terminal is connected to an input terminal of the resonator 16G. The filter band selection portion 60 includes capacitive elements 601, 602, 603, 604, and 605 which are connected in series to the resonator 16G, and switch elements 611, 612, 613, 614, and 615 which are respectively connected to corresponding capacitive elements 601 to 605 and switch a connection between at least one of the capacitive elements 601 to 605 and the resonator 16G, the previous stage amplification element 12, and the posterior stage amplification element 13. The filter band selection portion 60 varies a pass band and an attenuation band of the variable filter circuit by the switch elements 611 to 615 being switched by a control signal supplied from the control IC 11D.

The resonator 16G and the capacitive elements 601 to 605 and the switch elements 611 to 615 are arranged in a signal path from the output terminal of the previous stage amplification element 12 to the input terminal of the posterior stage amplification element 13, and configure a variable filter circuit which varies a pass band and an attenuation band in accordance with a frequency band of a high-frequency signal.

Additionally, the capacitive elements 601 to 605 and the switch elements 611 to 615 configure the filter band selection portion 60 which selectively switches the resonance point (for example, corresponding to the pass band) and the anti-resonance point (for example, corresponding to the attenuation band) of the resonator 16G in accordance with the frequency band of the high-frequency signal.

Note that, the variable filter circuit according to the present embodiment is not limited to the above-described configuration, may be configured such that the resonator 16G is connected to the previous stage amplification element 12, and the filter band selection portion 60 is connected to the posterior stage amplification element 13. Additionally, the capacitive elements 601 to 605 may be arranged on the previous stage amplification element 12 side, the switch elements 611 to 615 may be arranged on the posterior stage amplification element 13 side.

The control IC 11D is an amplification control portion which controls amplification characteristics of the previous stage amplification element 12 and the posterior stage amplification element 13 in accordance with a communication band to be selected and used (the frequency band of the high-frequency signal). The control IC 11D controls the switch elements 611 to 615 on the basis of a control signal indicating the communication band to be selected and used (the frequency band of the high-frequency signal) supplied from the RF signal processing circuit 3 or the baseband signal processing circuit 4. To be more specific, in a case where the above-described control signal indicates that a band B is selected, for example, the control IC 11D controls the switch elements 611 to 615 such that the resonator 16G and at least any one of the capacitive elements 601 to 605 configure filter characteristics whose pass band is the transmission band of the band B and whose attenuation band is the reception band of the band B.

According to the above-described configuration, the high-frequency transmission signal inputted into the PA module 10D from the RF signal processing circuit 3 or the baseband signal processing circuit 4 is amplified by the previous stage amplification element 12. The amplified high-frequency transmission signal is inputted into the variable filter circuit. The high-frequency transmission signal inputted into the variable filter circuit passes through at least one of the capacitive elements 601 to 605 corresponding to the communication scheme and the communication band and the resonator 16G. The high-frequency transmission signal which has passed through the variable filter circuit is further amplified by the posterior stage amplification element 13 and outputted from the PA module 10D.

Although, when the high-frequency transmission signal having the selected frequency band is amplified by the PA module, a reception band component of the frequency band is also amplified by the previous stage amplification element 12, the amplified reception band component attenuates by passing through a capacitive element and a resonator selected on the basis of the selected frequency band. Accordingly, it is possible to previously and effectively suppress, in the PA module 10D, the amplified reception band component from entering into the low noise amplifier circuit 20 or the like and being a reception band noise.

In the PA module 10D according to the present embodiment, the resonator 16G is stacked and arranged so as to overlap with at least one of the previous stage amplification element 12, the filter band selection portion 60, and the posterior stage amplification element 13, when a substrate on which these are mounted is viewed in a plan view.

Figure 9A:
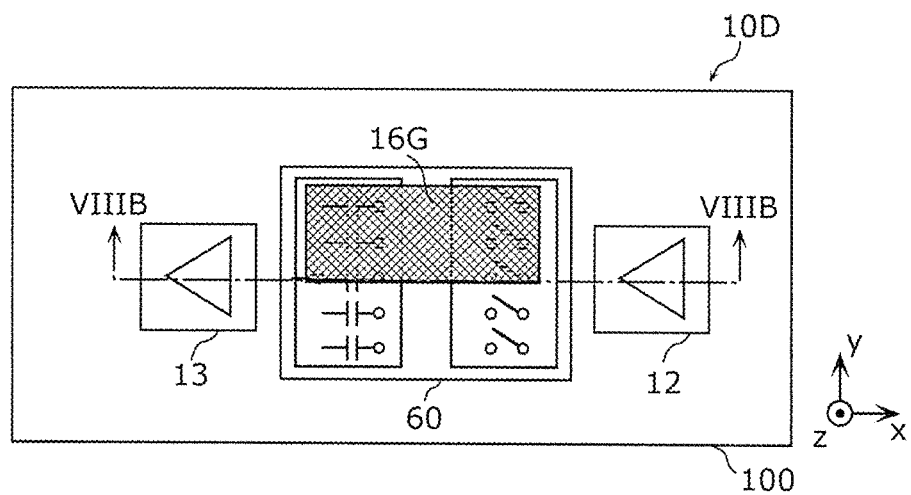
FIG. 9A is a planar configuration diagram of the PA module according to the second embodiment.

FIG. 9A is a planar configuration diagram of the PA module 10D according to the second embodiment, FIG. 9B is a cross-sectional configuration diagram of the PA module 10D according to the second embodiment. Specifically, FIG. 9B is a cross-sectional view taken by cutting along a VIIIB-VIIIB line in FIG. 9A.

As illustrated in FIG. 9A and FIG. 9B, in the PA module 10D according to the present embodiment, the previous stage amplification element 12, the posterior stage amplification element 13, and the filter band selection portion 60 are mounted and arranged on the substrate 100 (in a z-axis direction in the diagram). Furthermore, the resonator 16G is mounted and arranged on the filter band selection portion 60 (in the z-axis direction). In other words, the resonator 16G is stacked and arranged (stacked) so as to overlap with the filter band selection portion 60 when the substrate 100 is viewed in the plan view.

Examples of the substrate 100 include, in addition to a ceramic substrate, a glass epoxy substrate, a flexible substrate, or the like, an electrode pattern formed on a surface of the substrate 100 and each of the previous stage amplification element 12, the posterior stage amplification element 13, and the filter band selection portion 60 are bonded to each other using solder, a bump, or the like. Additionally, in the filter band selection portion 60 and the resonator 16G, an electrode pattern formed on an upper portion of the filter band selection portion 60 and an electrode pattern formed on a lower portion of the resonator 16G are bonded to each other using solder, a bump, or the like.

Note that, in FIG. 9A and FIG. 9B, illustration of wirings connecting the previous stage amplification element 12, the posterior stage amplification element 13, the filter band selection portion 60, and the resonator 16G is omitted.

According to the above-described configuration, by stacking and arranging the resonator 16G so as to overlap with the filter band selection portion 60 when the substrate 100 is viewed in the plan view, the area of the PA module 10D on the substrate 100 can be reduced. Accordingly, the size thereof can be reduced while maintaining quality of the high-frequency signal.

Note that, since a power level of the high-frequency signal to be amplified is large in the posterior stage amplification element 13, in a case the resonator 16G is arranged in the vicinity of the posterior stage amplification element 13, resonance characteristics of the resonator 16G deteriorate by interference with the above-described high-frequency signal. In contrast, in the PA module 10D according to the present embodiment, since the resonator 16G is not stacked and arranged on the posterior stage amplification element 13, the size can be reduced while effectively suppressing the deterioration in the characteristics of the resonator 16G.

Additionally, a power level in the previous stage amplification element 12 is not as large as that in the posterior stage amplification element 13, but is larger than those of other high-frequency signals. Accordingly, the resonator 16G can be not arranged in the vicinity of the previous stage amplification element 12 as well as the posterior stage amplification element 13. According to the configuration of the PA module 10D according to the present embodiment, since the resonator 16G is stacked and arranged so as not to overlap with the posterior stage amplification element 13 and the previous stage amplification element 12 in a plan view, the size can be reduced without necessarily deteriorating the characteristics of the resonator 16G.

Furthermore, in the PA module 10D according to the present embodiment, the resonator 16G is arranged so as to be closest to the filter band selection portion 60, a wiring length of the variable filter circuit can therefore be shortened.

Note that, although, in the PA module 10D according to the present embodiment, as illustrated in FIG. 9A and FIG. 9B, the configuration in which the resonator 16G is stacked and arranged on the filter band selection portion 60 is exemplified, the PA module according to the present embodiment is not limited thereto. The PA module according to the present embodiment may be configured such that the resonator 16G is stacked and arranged on the previous stage amplification element 12 or the posterior stage amplification element 13.

Third Embodiment

A PA module according to the present embodiment has a further different configuration from that of the PA module according to the first embodiment in a point that constituent elements of the PA module are appropriately formed in one chip. Hereinafter, descriptions of the same points in the PA module according to the present embodiment as the PA module according to the first embodiment will be omitted, and the different points will primarily be described.

3.1 PA Module Configuration

Figure 10A:
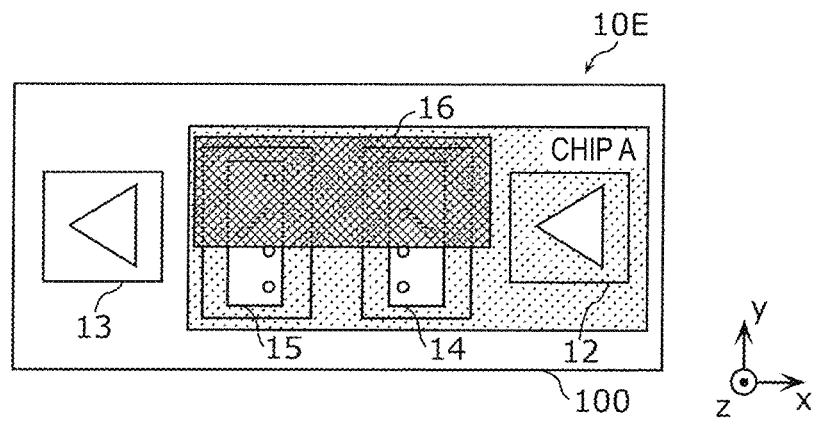
FIG. 10A is a planar configuration diagram of a PA module according to a third embodiment.

FIG. 10A is a planar configuration diagram of a PA module 10E according to a third embodiment. The PA module 10E is applied to the PA module 10 of the front-end circuit 1 illustrated in FIG. 1.

In the PA module 10E according to the present embodiment, the filter portion 16 is stacked and arranged so as to overlap with at least one of the previous stage amplification element 12, the filter band selection portion (the switches 14 and 15), and the posterior stage amplification element 13, when a substrate on which these are mounted is viewed in a plan view.

As illustrated in FIG. 10A, in the PA module 10E according to the present embodiment, the previous stage amplification element 12, the posterior stage amplification element 13, and the switches 14 and 15 are mounted and arranged on the substrate 100 (in a z-axis direction in the diagram). Furthermore, the filter portion 16 is mounted and arranged on the switches 14 and 15 (in the z-axis direction). In other words, the filter portion 16 is stacked and arranged (stacked) so as to overlap with the switches 14 and 15 when the substrate 100 is viewed in the plan view.

According to the above-described configuration, by stacking and arranging the filter portion 16 so as to overlap with the switches 14 and 15 when the substrate 100 is viewed in the plan view, the area of the PA module 10E on the substrate 100 can be reduced. Accordingly, the size thereof can be reduced while maintaining quality of the high-frequency signal.

Furthermore, in the PA module 10E according to the present embodiment, the previous stage amplification element 12 and the switches 14 and 15 are formed in one chip using a chip A (first chip). Furthermore, the posterior stage amplification element 13 is included in a chip which is different from the chip A.

With this, by configuring the previous stage amplification element 12 and the posterior stage amplification element 13 using chips which are different from each other, mutual interference of the high-frequency signals can be suppressed. Additionally, by forming the previous stage amplification element 12 and the switches 14 and 15 in one chip using the chip A, in comparison with a case where the previous stage amplification element 12 and the switches 14 and 15 are configured using chips which are different from each other, the size can be reduced. Accordingly, the size can be further reduced while maintaining quality of the high-frequency signal.

3.2 PA Module Configuration According to First Variation

Figure 10B:
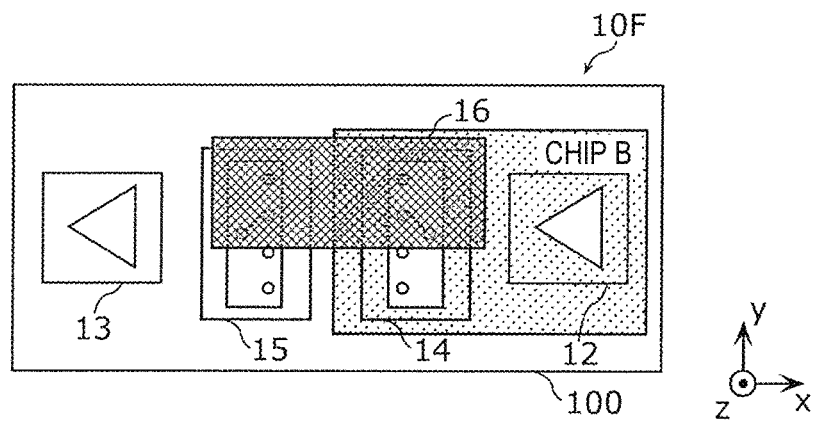
FIG. 10B is a planar configuration diagram of the PA module according to a first variation on the third embodiment.

FIG. 10B is a planar configuration diagram of a PA module 10F according to a first variation on the third embodiment. The PA module 10F according to the present variation includes the same constituent elements as those of the PA module 10E according to the third embodiment, but is different from the PA module 10E in a range of the constituent elements to be formed in one chip. Hereinafter, descriptions of each of the constituent elements configuring the PA module 10F will be omitted, and the points that are different from the PA module 10E will primarily be described.

In the PA module 10F according to the present variation, the previous stage amplification element 12 and the switch 14 are formed in one chip using a chip B (first chip). Furthermore, the posterior stage amplification element 13 is included in a chip which is different from the chip B.

According to the above-described configuration, by stacking and arranging the filter portion 16 so as to overlap with the switches 14 and 15 when the substrate 100 is viewed in the plan view, the area of the PA module 10F on the substrate 100 can be reduced.

Furthermore, by configuring the previous stage amplification element 12 and the posterior stage amplification element 13 using chips which are different from each other, mutual interference of the high-frequency signals can be suppressed. Additionally, by forming the previous stage amplification element 12 and the switch 14 in one chip using the chip B, in comparison with a case where the previous stage amplification element 12 and the switch 14 are configured using chips which are different from each other, the size can be reduced. Accordingly, the size can be further reduced while maintaining quality of the high-frequency signal.

3.3 PA Module Configuration According to Second Variation

Figure 10C:
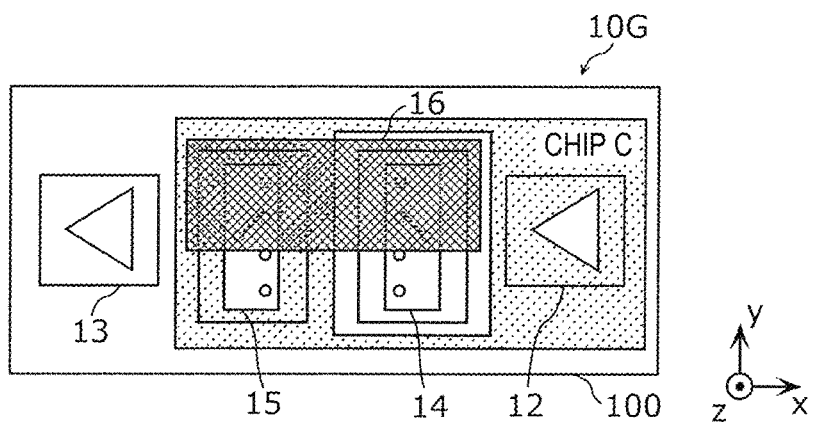
FIG. 10C is a planar configuration diagram of the PA module according to a second variation on the third embodiment.

FIG. 10C is a planar configuration diagram of a PA module 10G according to a second variation on the third embodiment. The PA module 10G according to the present variation includes the same constituent elements as those of the PA module 10E according to the third embodiment, but is different from the PA module 10E in a range of the constituent elements to be formed in one chip. Hereinafter, descriptions of each of the constituent elements configuring the PA module 10G will be omitted, and the points that are different from the PA module 10E will primarily be described.

In the PA module 10G according to the present variation, the previous stage amplification element 12 and the switch 15 are formed in one chip using a chip C (first chip). Furthermore, the posterior stage amplification element 13 is included in a chip which is different from the chip C.

According to the above-described configuration, by stacking and arranging the filter portion 16 so as to overlap with the switches 14 and 15 when the substrate 100 is viewed in the plan view, the area of the PA module 10G on the substrate 100 can be reduced.

Furthermore, by configuring the previous stage amplification element 12 and the posterior stage amplification element 13 using chips which are different from each other, mutual interference of the high-frequency signals can be suppressed. Additionally, by forming the previous stage amplification element 12 and the switch 15 in one chip using the chip C, in comparison with a case where the previous stage amplification element 12 and the switch 15 are configured using chips which are different from each other, the size can be reduced. Accordingly, the size can be further reduced while maintaining quality of the high-frequency signal.

Note that, in the PA modules 10E, 10F, and 10G according to the present embodiment and variations thereon, the control IC 11 may be included in the first chip. With this configuration, the size of the PA module can be further reduced. A power level of the control signal processed by the control IC 11 is much lower than the power levels of the high-frequency signals processed by the previous stage amplification element 12 and the posterior stage amplification element 13. Accordingly, even if the control IC 11 is formed in one chip with the previous stage amplification element 12 and the switches 14 and 15, quality of the high-frequency signals of the previous stage amplification element 12 and the posterior stage amplification element 13 can be secured.

3.4 Configuration Comparison of PA Module According to First and Third Embodiments Here, a case where each of the constituent elements of the PA module is mounted using an individual chip (the first embodiment) and a case where a plurality of constituent elements of the PA module are formed in one chip and mounted (the third embodiment) are compared.

Figure 11A:
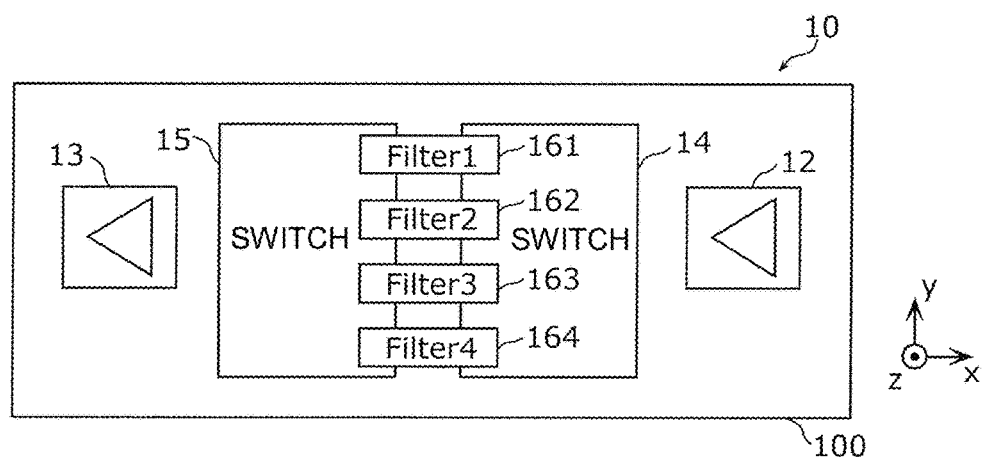
FIG. 11A is a diagram illustrating a specific planar configuration of the filter portion in the PA module according to the first embodiment.
Figure 11B:
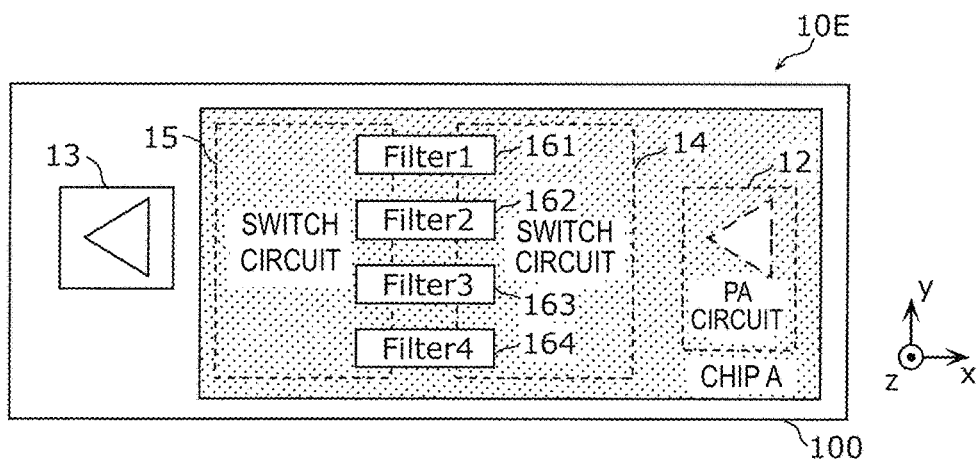
FIG. 11B is a diagram illustrating a specific planar configuration of the filter portion in the PA module according to the third embodiment.

FIG. 11A is a diagram illustrating a specific planar configuration of the filter portion 16 in the PA module 10 according to the first embodiment, FIG. 11B is a diagram illustrating a specific planar configuration of the filter portion 16 in the PA module 10E according to the third embodiment.

As illustrated in FIG. 11A, in the PA module 10 according to the first embodiment, each of the filter elements 161 to 164 configuring the filter portion 16 is stacked and arranged on the switches 14 and 15 configured of individual chips so as to span between the switches 14 and 15.

In contrast, as illustrated in FIG. 11B, in the PA module 10E according to the third embodiment, each of the filter elements 161 to 164 is stacked and arranged on the chip A in which the previous stage amplification element 12 and the switches 14 and 15 are formed in one chip. In the PA module 10E according to the third embodiment, in comparison with the PA module 10 configured of each of the individual chips, the previous stage amplification element 12 and the switches 14 and 15 can be connected and arranged in the chip A with a degree of freedom. Additionally, with this, a degree of freedom of an arrangement layout of the filter elements 161 to 164 is also increased. The degree of freedom of the arrangement layout being increased makes it possible to mount each of the constituent elements of the PA module with a further reduced area. Additionally, a distance between each of the filter elements 161 to 164 and each of the posterior stage amplification element 13 and the previous stage amplification element 12 can be secured with ease.

3.5 PA Module Configuration According to Third Variation

Figure 12A:
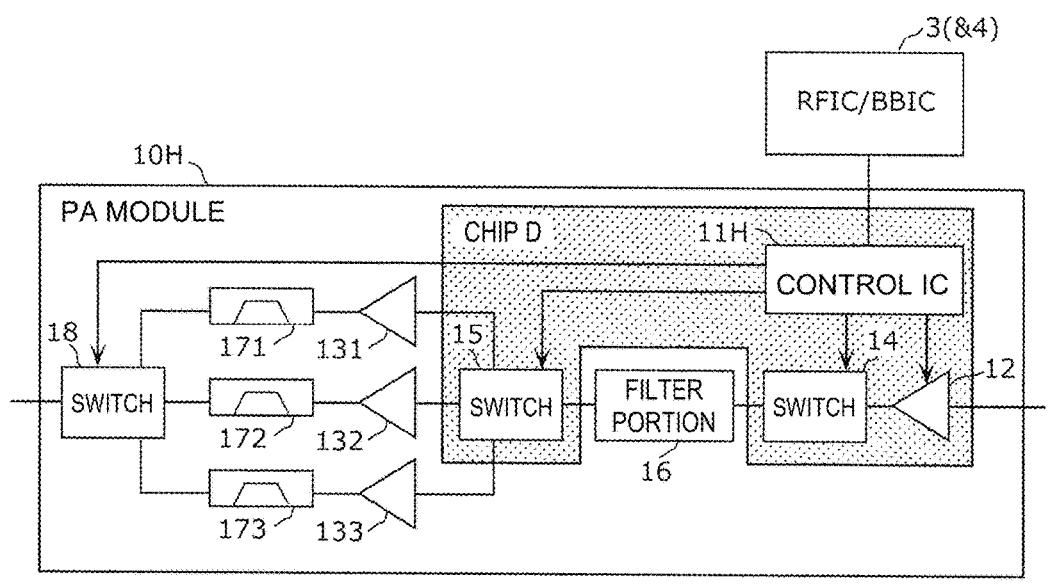
FIG. 12A is a circuit configuration diagram of the PA module according to a third variation on the third embodiment.

FIG. 12A is a circuit configuration diagram of a PA module 10H according to a third variation on the third embodiment. The PA module 10H according to the present variation is different from the PA module 10E according to the third embodiment in a configuration of the posterior stage amplification element and a point that a control IC 11H is included in the first chip. Hereinafter, descriptions of the same points as the PA module 10E will be omitted, and the points that are different from the PA module 10E will primarily be described.

In the PA module 10H according to the present variation, the previous stage amplification element 12, the switches 14 and 15, and the control IC 11H are formed in one chip using a chip D (first chip). In other words, the switches 14 and 15, which are the filter band selection portion, and the previous stage amplification element 12 are formed in one chip using the chip D. Furthermore, amplification elements 131 to 133 configuring the posterior stage amplification element are included in a chip which is different from chip D.

When amplifying the high-frequency transmission signal by the PA module with high quality, it is effective to provide difference in the amplification characteristics in the previous stage amplification element and the posterior stage amplification element which are in a cascading connection. In other words, in the previous stage amplification element, from the standpoint that the power level of the high-frequency transmission signal to be inputted is not so high, the high-frequency transmission signal is desired to be amplified across a wide band. On the other hand, from the standpoint that the posterior stage amplification element is arranged in the final stage of the PA module and the power level of the high-frequency transmission signal is high, the high-frequency transmission signal amplified by the previous stage amplification element is desired to be amplified with high quality.

Here, a high frequency amplification element generally has a trade-off relationship between the frequency characteristics and gain and noise characteristics. In other words, selection whether to give priority to the wide band amplification rather than the gain and noise characteristics or to give priority to the gain and noise characteristics even with a narrow band may be required.

Accordingly, in the present variation, one amplification element capable of amplifying the high-frequency signal across the wide band rather than the gain characteristics and noise characteristics is arranged in the previous stage amplification element. On the other hand, in the posterior stage amplification element, since high gain characteristics and low noise characteristics are required rather than the wide band characteristics, a plurality of amplification elements having high gain characteristics and low noise characteristics in each of the frequency bands are arranged in parallel.

As illustrated in FIG. 12A, the PA module 10H includes the amplification elements 131, 132, and 133 connected in parallel to the switch 15 as the posterior stage amplification element. The PA module 10H further includes a switch 18 to switch selection of the amplification elements 131 to 133 in accordance with the frequency band to be selected, and a transmission side filter element 171 connected to the amplification element 131, a transmission side filter element 172 connected to the amplification element 132, and a transmission side filter element 173 connected to the amplification element 133, which are arranged between the switches 15 and 18.

According to the above-described configuration, configuring the previous stage amplification element with one amplification element can contribute to reduction in size of the PA module 10H, and arranging a plurality of posterior stage amplification elements corresponding to the pass bands makes it possible to maintain high quality of the high-frequency transmission signal outputted from the PA module 10H.

Additionally, in the PA module 10H according to the present variation, the control IC 11H included in the chip D controls not only the previous stage amplification element 12 and the switches 14 and 15 but also the switch 18. With this configuration, the switches 14, 15, and 18 are controlled by the same control IC 11H, the filter characteristics can therefore be switched with high quality.

3.6 PA Module Configuration According to Fourth Variation

Figure 12B:
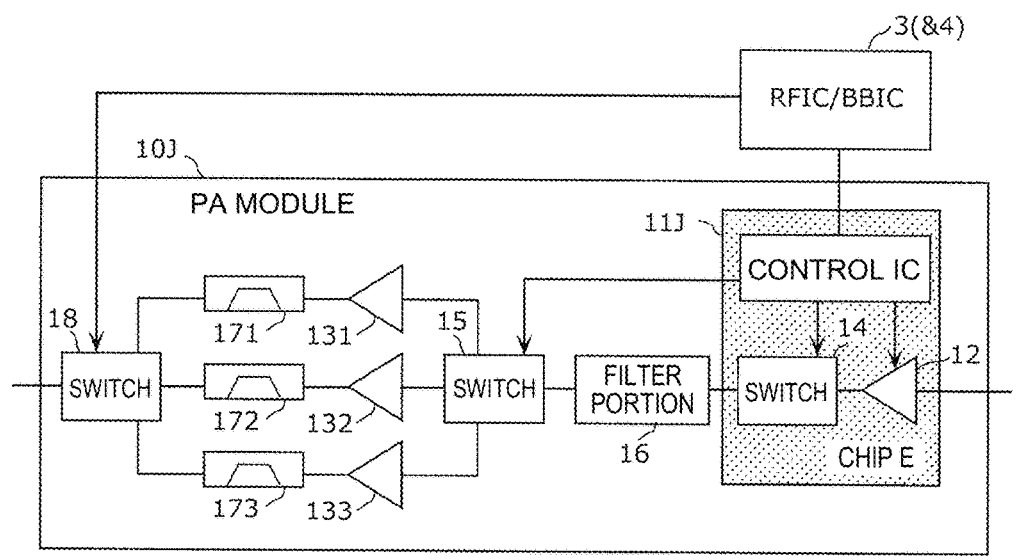
FIG. 12B is a circuit configuration diagram of the PA module according to a fourth variation on the third embodiment.
Figure 13:
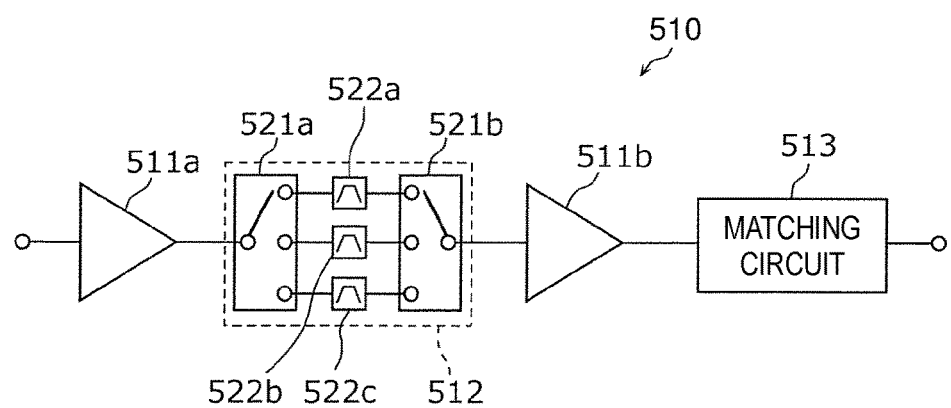
FIG. 13 is a circuit configuration diagram of a PA module disclosed in Patent Document 1.

FIG. 12B is a circuit configuration diagram of a PA module 10J according to a fourth variation on the third embodiment. The PA module 10J according to the present variation includes the same constituent elements as those of the PA module 10H according to the third variation, but is different from the PA module 10H in a range of the constituent elements to be formed in one chip and a control object of the control IC. Hereinafter, descriptions of each of the constituent elements configuring the PA module 10J will be omitted, and the points that are different from the PA module 10H will primarily be described.

In the PA module 10J according to the present variation, the previous stage amplification element 12, the switch 14, and the control IC 11J are formed in one chip using a chip E (first chip). In other words, the switch 14, which is at least a part of the filter band selection portion, and the previous stage amplification element 12 are formed in one chip using the chip E. Furthermore, the amplification elements 131 to 133 are included in a chip which is different from the chip E.

With this configuration, since the control IC 11J is formed in one chip with the previous stage amplification element 12 and the switch 14, the size can be reduced.

Additionally, configuring the previous stage amplification element with one amplification element can contribute to reduction in size of the PA module 10J, and arranging a plurality of posterior stage amplification elements corresponding to the pass bands makes it possible to maintain high quality of the high-frequency transmission signal outputted from the PA module 10J.

Additionally, the control IC 11J included in the chip E does not control the switch 18, the RF signal processing circuit 3 (or the baseband signal processing circuit 4) controls the switch 18. With this configuration, an out-of-chip wiring from the chip E can be reduced.

3.7 Other Variations or the Like

Note that, in the third embodiment and the first to fourth variations thereon, the first chips (the chips A to E) can be configured of a CMOS (Complementary Metal Oxide Semiconductor), and second chips can be configured of GaAs.

In other words, configuring the control IC and the previous stage amplification element 12, which do not require power handling, of the CMOS makes it possible to manufacture the PA module at a low cost. On the other hand, configuring the posterior stage amplification element 13 (and the amplification elements 131 to 133), in which a power level of the high-frequency transmission signal is high, of a GaAs based material makes it possible to output a high-frequency transmission signal having high quality amplification characteristics and noise characteristics.

Other Embodiments or the Like

Although the power amplification (PA) modules according to the embodiments of the present disclosure have been described above using the embodiments and the variations, the power amplification (PA) modules of the present disclosure are not limited to the above-described embodiments and variations. The present disclosure also encompasses other embodiments that are implemented by combining desired constituent elements in the above-described embodiments and variations, variations obtained by adding various changes to the above-described embodiments and variations, which are conceived by those skilled in the art, without necessarily departing from the gist of the present disclosure, and various apparatuses incorporating the power amplification (PA) module of the present disclosure.

For example, the configurations of the third embodiment and the first to fourth variations thereon may be applied to the PA module 10D according to the second embodiment.

Additionally, in the power amplification (PA) modules according to the above-described embodiments and variations, other high frequency circuit elements, wirings, and the like may be inserted between paths connecting each circuit element and signal path disclosed in the drawings.

Additionally, as described above, the variable filter circuit included in the power amplification (PA) module may be a filter circuit for attenuation with respect to a reception frequency band. According to such a configuration, in a case where the signal in the reception frequency band is present in the transmission signal component amplified by the previous stage amplification element 12, the signal in the reception frequency band can be attenuated by the variable filter circuit, it is thus possible to prevent the transmission signal from sneaking into the reception circuit.

Additionally, the variable filter circuit may be a filter circuit to attenuate a signal in a frequency band other than a used channel which is used among TV idle channels or/and an IMD noise. According to such a configuration, in a system utilizing the idle channels among the TV channels for other communication, the attenuation can be performed with respect to the frequency of an adjacent channel of the channels to be used, the idle channels of the TV channels can therefore effectively be utilized.

Additionally, the present disclosure may be the front-end circuit 1 including the power amplification (PA) module 10 having the characteristic configurations as described above, the reception amplification circuit (low noise amplifier circuit) 20, the wave separator (antenna switch) 40 to output the reception signal from the antenna element 2 to the reception amplification circuit (low noise amplifier circuit) 20 and to output the high-frequency signal amplified by the power amplification (PA) module 10 to the antenna element 2 as a transmission signal, in which in the variable filter circuit, the pass band is a transmission band corresponding to a communication band to be used which is selected from a plurality of communication bands, the attenuation band is the reception band corresponding to the communication band to be used.

According to the above-described configuration, the front-end circuit reduced in size can be provided while maintaining quality of the high-frequency transmission signal and the high-frequency reception signal.

Additionally, the present disclosure may be the communication device 200 having the front-end circuit 1 including the characteristic configurations as described above, the RF signal processing circuit 3 to output the high-frequency transmission signal to the front-end circuit 1 and to which the high-frequency reception signal is inputted from the front-end circuit 1, and the baseband signal processing circuit 4 to perform signal processing by converting the high-frequency reception signal received from the RF signal processing circuit 3 to an intermediate frequency signal and to convert the intermediate frequency signal to the high-frequency signal and output the converted signal to the RF signal processing circuit 3.

According to the above-described configuration, the communication device reduced in size can be provided while maintaining quality of the high-frequency transmission signal and the high-frequency reception signal.

Additionally, the control ICs (11, 11D, 11H, and 11J) according to the present disclosure may be each realized as an IC and an LSI (Large Scale Integration) being an integrated circuit. Additionally, a circuit integration method may be realized by dedicated circuits or a multi-purpose processor. An FPGA (Field Programmable Gate Array) programmable after manufacturing the LSI or a reconfigurable processor whose connection or setting of the circuit cell in the inside of the LSI can be reconfigured may be used. Furthermore, if with advances in semiconductor technology or other derivative technology, a circuit integration technology with which the LSI is replaced appears, functional blocks may of course be integrated using the technology.

INDUSTRIAL APPLICABILITY

The present disclosure can be widely used for communication apparatuses such as a cellular phone or the like as a power amplification module arranged in a multiband/multimode-compliant front-end portion.

REFERENCE SIGNS LIST

1 FRONT-END CIRCUIT
2 ANTENNA ELEMENT
3 RF SIGNAL PROCESSING CIRCUIT
4 BASEBAND SIGNAL PROCESSING CIRCUIT
5 DISPLAY PORTION
10, 10A, 10B, 10C, 10D, 10E, 10F, 10G, 10H, 10J, 510 PA MODULE (POWER AMPLIFICATION MODULE)
11, 11D, 11H, 11J CONTROL IC
12 PREVIOUS STAGE AMPLIFICATION ELEMENT
13 POSTERIOR STAGE AMPLIFICATION ELEMENT
14, 15, 18 SWITCH
14$s$1 FIRST SELECTION TERMINAL
15$s$1 SECOND SELECTION TERMINAL
16 FILTER PORTION
16G RESONATOR
20 LOW NOISE AMPLIFIER CIRCUIT (RECEPTION AMPLIFICATION CIRCUIT)
30 ANTENNA MATCHING CIRCUIT
40 ANTENNA SWITCH
60 FILTER BAND SELECTION PORTION
100 SUBSTRATE
131, 132, 133, 511$a$, 511$b$ AMPLIFICATION ELEMENT
161, 162, 163, 164 FILTER ELEMENT
161$a$ INPUT TERMINAL
161$b$ OUTPUT TERMINAL
171, 172, 173 TRANSMISSION SIDE FILTER ELEMENT
200 COMMUNICATION DEVICE
512 VARIABLE FILTER CIRCUIT
513 MATCHING CIRCUIT
521$a$, 521$b$ SWITCH CIRCUIT
522$a$, 522$b$, 522$c$ FILTER COMPONENT
601, 602, 603, 604, 605 CAPACITIVE ELEMENT
611, 612, 613, 614, 615 SWITCH ELEMENT

The invention claimed is:

1. A power amplification module comprising:
a previous stage amplifier configured to amplify a high-frequency signal;
a posterior stage amplifier configured to amplify the high-frequency signal amplified by the previous stage amplifier; and
a variable filter circuit arranged between the previous stage amplifier and the posterior stage amplifier, and configured to vary a pass band or an attenuation band thereof based on a frequency band of the high-frequency signal, wherein:
the variable filter circuit comprises:

one or more filters, and
  a switch circuit configured to vary the pass band or the attenuation band of the variable filter circuit by switching a connection path through the one or more filters based on the frequency band of the high-frequency signal,
the previous stage amplifier, the switch circuit, and the posterior stage amplifier are arranged on a mounting surface of a substrate,
the one or more filters are stacked and arranged so as to overlap with only the switch circuit when the substrate is viewed in a plan view.

2. A power amplification module comprising:
a previous stage amplifier configured to amplify a high-frequency signal;
a posterior stage amplifier configured to amplify the high-frequency signal amplified by the previous stage amplifier;
a plurality of filters, each of the plurality of filters having a pass band or an attenuation band different from the other filters, and
a variable filter circuit arranged between the previous stage amplifier and the posterior stage amplifier, and configured to vary a pass band or an attenuation band thereof based on a frequency band of the high-frequency signal, wherein:
the variable filter circuit comprises:
  one or more filters, and
  a switch circuit configured to vary the pass band or the attenuation band of the variable filter circuit by switching a connection path through the one or more filters based on the frequency band of the high-frequency signal,
the previous stage amplifier, the switch circuit, and the posterior stage amplifier are arranged on a mounting surface of a substrate,
the one or more filters are stacked and arranged so as to overlap with only at least one of the previous stage amplifier and the switch circuit when the substrate is viewed in a plan view,
the switch circuit comprises:
  a first switch arranged between the previous stage amplifier and the plurality of filters, and configured to switch a connection between an output terminal of the previous stage amplifier and each of the plurality of filters, and
  a second switch arranged between the plurality of filters and the posterior stage amplifier, and configured to switch a connection between an input terminal of the posterior stage amplifier and each of the plurality of filters, and
the plurality of filters are arranged so as to overlap with at least one of the first switch and the second switch when the substrate is viewed in the plan view.

3. The power amplification module according to claim 2, wherein:
each of the plurality of filters comprises an input terminal and an output terminal,
the first switch comprises a first common terminal connected to the output terminal of the previous stage amplifier and a first selection terminal connected to the input terminal of one of the plurality of filters,
the second switch comprises a second common terminal connected to the input terminal of the posterior stage amplifier and a second selection terminal connected to an output terminal of the one of the plurality of filters, and the first selection terminal and the second selection terminal are arranged at a distance apart from each other such that when the one of the plurality of filters is not connected to the first switch and the second switch, isolation between the first selection terminal and the second selection terminal does not deteriorate more than isolation between the input terminal and the output terminal of the one of the plurality of filters.

4. The power amplification module according to claim 3, wherein the distance is larger than a distance between the input terminal and the output terminal of the one of the plurality of filters.

5. The power amplification module according to claim 3, wherein an attenuation of the one of the plurality of filters in the attenuation band is 16 dB or greater.

6. The power amplification module according to claim 2, wherein:
at least one of the first switch, the second switch, and the previous stage amplifier are formed on a first chip, and
the posterior stage amplifier is included on a second chip that is different from the first chip.

7. A power amplification module comprising:
a previous stage amplifier configured to amplify a high-frequency signal;
a posterior stage amplifier configured to amplify the high-frequency signal amplified by the previous stage amplifier; and
a variable filter circuit arranged between the previous stage amplifier and the posterior stage amplifier, and configured to vary a pass band or an attenuation band thereof based on a frequency band of the high-frequency signal, wherein:
the variable filter circuit comprises:
  one or more filters, and
  a switch circuit configured to vary the pass band or the attenuation band of the variable filter circuit by switching a connection path through the one or more filters based on the frequency band of the high-frequency signal,
the previous stage amplifier, the switch circuit, and the posterior stage amplifier are arranged on a mounting surface of a substrate, and
the one or more filters are stacked and arranged so as to overlap with at least one of the previous stage amplifier, the switch circuit, and the posterior stage amplifier when the substrate is viewed in a plan view, wherein:
at least a part of the switch circuit and the previous stage amplifier are formed on a first chip, and
the posterior stage amplifier is included on a second chip that is different from the first chip.

8. The power amplification module according to claim 7, further comprising:
an amplification control circuit configured to control amplification characteristics of the previous stage amplifier and the posterior stage amplifier based on a communication band for transmitting the high-frequency signal,
wherein the amplification control circuit is included on the first chip.

9. The power amplification module according to claim 1, wherein:
the previous stage amplifier is configured to amplify the high-frequency signal in a frequency range including a plurality of communication bands,
the posterior stage amplifier comprises a plurality of amplifiers respectively corresponding to the plurality of communication bands, each of the plurality of amplifiers being configured to amplify the high-frequency signal amplified by the previous stage amplifier.

10. A front-end circuit comprising:

the power amplification module according to claim 1;

a reception amplification circuit; and a wave separator configured to output a reception signal from an antenna to the reception amplification circuit and to output the high-frequency signal amplified by the power amplification module to the antenna as a transmission signal.

11. The front-end circuit according to claim 10, wherein the pass band of the variable filter circuit is a transmission band corresponding to a communication band for transmitting the high-frequency signal, and the attenuation band of the variable filter circuit is a reception band corresponding to the communication band.

12. A communication device comprising:

the front-end circuit according to claim 10;

an RF signal processing circuit configured to output the high-frequency signal to the front-end circuit and to which a high-frequency reception signal is inputted from the front-end circuit; and a baseband signal processing circuit configured to convert the high-frequency reception signal received from the RF signal processing circuit to a first intermediate frequency signal, and to convert a second intermediate frequency signal to the high-frequency signal and output the high-frequency signal to the RF signal processing circuit.

* * * * *